United States Patent [19]

Schultz et al.

[11] Patent Number: 5,448,719
[45] Date of Patent: Sep. 5, 1995

[54] METHOD AND APPARATUS FOR MAINTAINING AND RETRIEVING LIVE DATA IN A POSTED WRITE CACHE IN CASE OF POWER FAILURE

[75] Inventors: Stephen M. Schultz, Houston; Randy D. Schneider, Spring, both of Tex.

[73] Assignee: Compaq Computer Corp., Houston, Tex.

[21] Appl. No.: 894,111

[22] Filed: Jun. 5, 1992

[51] Int. Cl.⁶ ............................................. G06F 11/34
[52] U.S. Cl. ............................... 395/182.03; 364/285; 364/243.4; 371/21.1; 395/182.12; 395/750; 395/468; 395/488
[58] Field of Search ................ 395/575, 275, 500, 400, 395/425; 364/228.3, 232.9, 243.4, 254.3, 925.5, 285; 371/10.1, 21.2, 16.1, 37.5, 40.1, 40.2, 21.1, 66

[56] References Cited

U.S. PATENT DOCUMENTS

| | | | |
|---|---|---|---|
| 4,394,733 | 7/1983 | Swenson | 395/425 |
| 4,476,526 | 10/1984 | Dodd | 395/425 |
| 4,506,323 | 3/1985 | Pusic et al. | 395/575 |
| 4,523,206 | 6/1985 | Sasscer | 395/425 |
| 4,523,275 | 6/1985 | Swenson et al. | 395/425 |
| 4,718,064 | 1/1988 | Edwards et al. | 371/16.1 |
| 4,989,205 | 1/1991 | Dunphy, Jr. et al. | 371/10.1 |
| 4,989,206 | 1/1991 | Dunphy et al. | 371/10.1 |
| 5,065,354 | 11/1991 | Jons et al. | 395/575 |
| 5,142,627 | 8/1992 | Elliot et al. | 395/27.5 |
| 5,195,100 | 3/1993 | Katz et al. | 371/66 |
| 5,206,943 | 4/1993 | Callison et al. | 395/425 |
| 5,210,866 | 5/1993 | Milligan et al. | 395/575 |

FOREIGN PATENT DOCUMENTS

0481508A2 4/1992 European Pat. Off. .
WO91/14982 10/1991 WIPO .

OTHER PUBLICATIONS

"No Modified Data Indicator for Caching Subsystem", IBM Technical Disclosure Bulletin, vol. 33, No. 2, Jul. 1990, pp. 301–302.

"The IBM 3990 Disk Cache", Jai Menon, Feb. 1988, pp. 146–151.

Meador, Wes E.; "Disk Array Systems"; 1989; COMPCON, Reprinted IEEE Computer Society; pp. 143–146.

Ng, S.; "Some Design Issues of Disk Arrays"; 1989; pp. 137–142.

Patterson, D. A., Gibson, G., Katz, R. H.; "A Case for Redundant Arrays of Inexpensive Disks (RAID)"; Dec., 1987; pp. 1–24.

*Primary Examiner*—Robert W. Beausoliel, Jr.
*Attorney, Agent, or Firm*—Pravel, Hewitt, Kimball & Krieger

[57] ABSTRACT

A host computer including a posted write cache for a disk drive system where the posted write cache includes battery backup to protect against potential loss of data in case of a power failure, and also including means for performing a method for determining if live data is present in the posted write cache upon power-up. The posted write cache is further mirrored and parity-checked to assure data validity. Performance increase is achieved since during normal operation data is written to the much faster cache and a completion indication is returned, and the data is flushed to the slower disk drive system at a more opportune time. Batteries provide power to the posted write cache in the event of a power failure. Upon subsequent power-up, a cache signature previously written in the posted write cache indicates that live data still resides in the posted write cache. If the cache signature is not present and the batteries are not fully discharged, a normal power up condition exists. If the cache signature is not present and the batteries are fully discharged, then the user is warned of possible data loss. A configuration identification code assures a proper correspondence between the posted write cache board and the disk drive system. A mirror test executed to verify data validity. Temporary and permanent error conditions are monitored so that posted write operations are only enabled when error-free operation is assured.

27 Claims, 14 Drawing Sheets

METHOD AND APPARATUS FOR MAINTAINING AND RETRIEVING LIVE DATA IN A POSTED WRITE CACHE IN CASE OF POWER FAILURE

BACKGROUND OF THE INVENTION

1. Field of the Invention

The present invention relates to a battery back-up apparatus for maintaining data in a posted write cache in the event of a primary power failure and a method for determining if live data is present in the posted write cache upon power-up.

2. Description of the Related Art

The performance of the microprocessor or central processing unit (CPU) of a computer system has increased dramatically due to the expanding personal computer and small work station computer markets. For example, microprocessors have gone from 8 bit data widths and operating frequencies of 1 MHz to 32 bit data widths and basic clock rates of 33 MHz. The internal electronic memory of computer systems, typically implemented by dynamic and static random access memory (RAMs), has basically kept pace with the advancing CPU technology so that a computer system's main memory implemented by RAM is faster and more reliable. In contrast, the mass data storage portion of a computer system has experienced only modest growth in speed and reliability. This trend is undesirable since the overall system speed is not increased substantially in systems where input/output (I/O) operations are emphasized. In many applications, for example, a substantial number of reads and writes to the mass data storage devices or hard disk drive media essentially becomes a bottleneck of the computer system.

In the past few years, a new trend in mass data storage systems, generally referred to as disk array systems, has emerged for improving transfer performance. A disk array system comprises a multiple number of smaller disk drives organized into an array of drives accessed as a single logical unit. The disk array system replaces a single large expensive data drive to achieve a high capacity data storage system with a very high data transfer rate. A technique referred to a "striping" further enhances the effective transfer rate, especially if large amounts of data are frequently transferred to and from the disk array system. The primary problem with disk array systems is that several smaller disk drives ganged together dramatically decreases the mean time that any one disk will fail, which, in turn, increases the risk of data loss. The problem has been addressed by including redundancy in the disk array system so that the data lost on any failed disk drive can be reconstructed through the redundant information stored on the surrounding disk drives. Five different levels of redundant arrays of inexpensive disks (RAID) are introduced and analyzed by D. Patterson, G. Gibson and R. Katz, "A Case for Redundant Arrays of Inexpensive Disks (RAID)", December, 1987. Other relevant articles include "Some Design Issues of Disk Arrays" by Spencer Ng April, 1989 IEEE, and "Disk Array Systems" by Wes E. Meador, April, 1989 IEEE.

Many techniques have been proposed including data protection and recovery techniques which have improved the speed and reliability of disk array systems. Nonetheless, there may be disadvantages when a disk array system is combined with traditional operating systems, such as DOS (disk operating system) and UNIX, where these operating systems perform many small writes which are often smaller then the stripe size of the disk array system resulting in partial stripe write operations. Disk performance is adversely effected because redundant information must be updated on those drives containing the redundant information each time a write occurs on any of the other drives. This is especially true in the case of small writes, where updates may require two reads and two writes for every write operation to compute and write the parity sector. It becomes necessary therefore to access data from drives not being written to in order to update parity information. Thus, delays occur due to seek time and rotational latency of the disk drives as well as lost time due to additional reads which are necessary to generate the redundant data in a disk array system.

In earlier systems, the host computer itself had to perform the operation of data distribution and control of the various controller boards and the specific drives on a given controller board, as well as perform various parity operations required to generate the necessary data redundancy. This significantly tied up the host computer. Recent bus architecture developments including the use of "bus masters" can perform these functions freeing up the host computer. A bus master may take control of the computer system at certain times and transfer data between the bus master and the system memory without requiring the service of the main or host processor. The bus master can then release the bus back to the host processor when the transfers are not necessary. In this manner, coprocessing tasks can be developed. The various buses or architectures are exemplified by the Micro Channel Architecture (MCA) developed by International Business Machines Corporation (IBM) or the Extended Industry Standard Architecture (EISA). A copy of the EISA specification, provided as Appendix 1 to U.S. Pat. No. 5,101,492, which is hereby incorporated by reference, explains the requirements of an EISA system. Thus it became obvious to place a local processor on a separate board which could be inserted into these busses for disk coprocessing functions. However, it then became critical, particularly when combined with a disk array system, to allow optimal data transfer capabilities without otherwise slowing down the various devices and capabilities.

To this end, Compaq Computer Corporation developed a disk array controller with improved parity development. The disk array controller was incorporated in a product referred to as the Intelligent Drive Array or IDA, which was sold in December, 1989 and thereafter. The system operated as a bus master in a personal computer. A local processor was included to handle and control operations in the disk array controller, and was interfaced with a bus master controller and with a data transfer controller. The data transfer controller also interfaced with the bus master controller. The bus master controller was used to provide disk array system access to the host computer system for transferring disk commands and data. The transfer controller operated as a direct memory access (DMA) controller having four main channels.

A second avenue of obtaining and returning data and commands to the host system was through a compatibility controller. The compatibility controller was also linked to the transfer controller. Additionally, up to eight individual hard disk drives, which have integrated device controllers, were linked to the transfer controller. Finally, an amount of transfer buffer memory was coupled to the transfer controller. Eventually the need for even higher throughput then that provided by the IDA was needed was applications grew larger and local area networks (LANs) became larger, the IDA being primarily used in a file server on the LAN.

Several other techniques have been proposed and used which improve the hard disk drives themselves where the drives include intermediate buffers to temporarily contain data written to and read from the disk drive. For example, the typical drive systems of today use interface drive electronics (IDE) where the disk drives include a look ahead buffer which reads an entire extra track every time it reads a requested track. In this manner, the information on the look ahead buffer can be retrieved much quicker on the next read access. This technique has been expanded until some drives actually use multiple track look ahead buffers. There are also drives which include a buffer for write operations where data is written to the buffer in the drive before actually being written on the hard drive system so that the computer system does not have to wait for additional seek delays. Drive buffers have marginally improved the performance of the hard disk drive system but are typically limited to relatively small buffer sizes since larger buffers substantially increase the cost of each drive.

Still other techniques have been used to increase the overall speed and performance of a computer system. In one method, part of the internal RAM of a computer system is implemented to appear as a logical disk drive to the computer so that data is written to it instead of a logical disk drive. This technique eliminates delays to the disk drive during use since the data is saved much more quickly in RAM. The data must be transferred, however, to the disk array system before the computer system is turned off. Another technique is referred to as disk caching which is similar to the above technique. A portion of the computer's main memory is used instead as a disk cache which serves as an intermediary storage device for disk memory. A technique referred to as write posting writes data to the cache and indicates that the operation is complete. The write operation is completed later, when the data is written to the disk array system, at a more opportune time such as when the system is idle or less active. These techniques are unacceptable if a high percentage of the data is critical. Should a power failure occur while the critical data resides in RAM before being written to the disk array system, the data is irretrievably lost. Therefore conventional write posting to a cache is not considered acceptable in many environments, such as networks.

The techniques discussed above have improved I/O throughput, but further speed increases are now necessary due to constant demands for increasing speed and reliability. It is therefore desirable to improve the performance of a computer system by substantially reducing delays of writing data to the disk array system without substantially increasing the risk of losing critical data.

SUMMARY OF THE PRESENT INVENTION

A computer system according to the present invention includes memory implemented as a posted write cache and a battery back-up system to protect against loss of data during power failure, and implements a method for determining if the posted write cache contains live or dirty data upon power-up. Much of the data that is to be written to a disk drive system is temporarily stored in the posted write cache. Write posting techniques provide the substantial performance gain mentioned above since the data is written to the disk drive system at a more opportune time, such as when the system is idle.

In the preferred embodiment, the posted write cache is utilized on a development of the controller in the IDA. The cache includes an interface which allows it to emulate a conventional integrated drive electronics (IDE) disk drive. This allows simple connection to the drive channel support of the IDA. The controller software then has control of data transfer with the cache by its normal, high speed operations. The controller board preferably includes a local processor and a means for receiving a daughter board including the posted write cache. Status information is stored on the posted write cache to determine whether "dirty" data is in the cache during normal operation and, if so, the location of the data. Dirty data is data written to the posted write cache intended for the disk array system, but not yet copied, or "flushed", to the disk array system. A data flush routine running on the local processor constantly scans the posted write cache, consolidates contiguous data segments, and flushes dirty data to the disk array system when expedient.

To maintain data integrity in the posted write cache, the RAM may be configured into a mirrored configuration and further protected through the addition of parity generation. In the mirrored configuration, data is saved in duplicate copies where each copy resides in a physically different RAM chip on the posted write cache. In this manner, if a parity error occurs reading the primary copy, the mirrored copy is retrieved so that there is less chance of data loss. The host computer is not provided with a request completion until after the data is saved in duplicate. Several batteries are provided to supply back-up power to the posted write cache to help assure that data stored in the posted write cache survives a primary system power loss without corruption for a reasonable period of time. To preserve battery power, the batteries are switched into a standby mode during normal operations when data is written to the posted write cache. The batteries are switched out of standby mode when all dirty data is flushed to the disk array system, so that the batteries would be used only when necessary. These techniques provide a sufficient level of fault tolerance that ensures a very high probability that all of the data can be retrieved error free in the event of primary power failure.

The local microprocessor writes configuration data which includes a configuration identification code. The identification code is stored in the disk array system as well as in the posted write cache. Since the identification code is unique, it provides a way to match a given posted write cache board with a given disk array system to prevent data mismatch. Also, a cache signature is placed in the posted write cache to indicate whether dirty data was stored in the posted write cache before the last power down or power failure.

In a method according to the present technique, upon each power up of the host computer, the local processor first monitors the configuration data on the disk array system to determine if the disk array system indicates that posted write operations are in effect. The local processor also monitors the posted write cache to determine if the cache signature exists, thereby indicating that dirty data exists in the posted write cache. If the cache signature is found, the configuration identification code is then checked and compared to the corresponding configuration identification code on the disk array system. If the identification codes do not match, it indicates that the wrong posted write cache is plugged into the disk array controller. If the configuration identification codes match, then the post write cache contains dirty data intended for the disk array system. A mirror check is then performed on all of the dirty data present in the posted write cache to determine data integrity. If the cache signature is not found, there is no retrievable data in the posted write cache.

After the mirroring check or not finding a cache signature, the status of the batteries is determined to further assess the validity of the dirty data, if it exists, and also to determine if and when posted write operations should resume. If all of the batteries are low and if the cache signature did not exist on the posted write cache or the mirroring check failed, data loss may have occurred and the user is notified. Posted write operations are temporarily disabled until the batteries are charged to a sufficient level. If dirty data is present in the posted write cache, the batteries are acceptable and the mirroring check passed, posted write cache operation is enabled and the dirty data is eventually flushed during normal operations. If the batteries were acceptable and no cache signature was found, the posted write cache operation is enabled. In all other cases, and in those cases if other errors exist, posted write cache operation is disabled.

BRIEF DESCRIPTION OF THE DRAWINGS

A better understanding of the present invention can be obtained when the following detailed description of the preferred embodiment is considered in conjunction with the following drawings in which.

DETAILED DESCRIPTION OF THE PREFERRED EMBODIMENT

Figure 1:
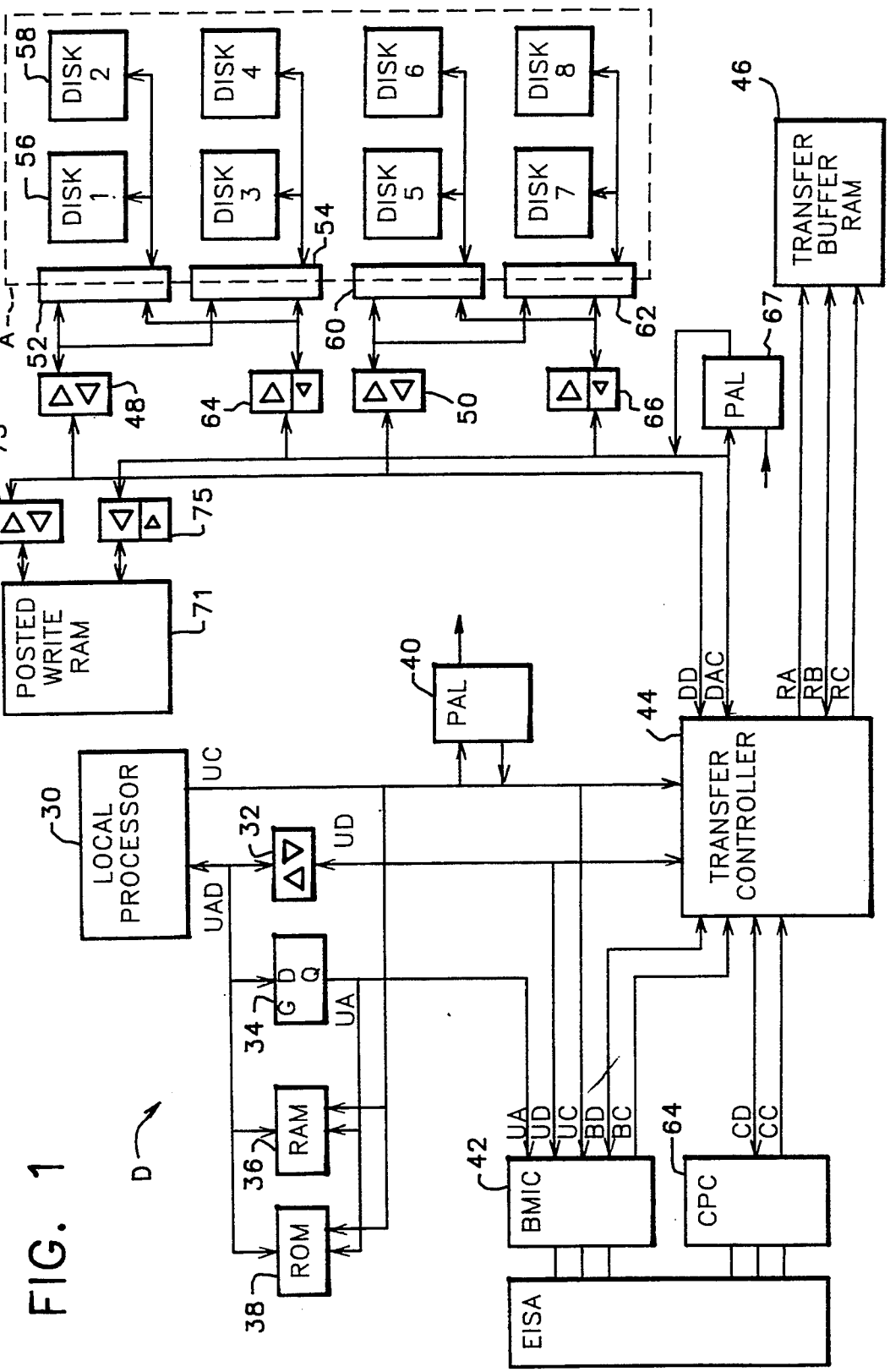
FIG. 1 is block diagram of a disk array controller incorporating the present invention.

Referring now to FIG. 1, the letter D general represents a disk array controller incorporating the present invention. FIGS. 1-6 show only relevant portions of the disk array controller D for purposes of the present disclosure, and many other details are omitted for clarity. For more details of the hardware configuration of the disk array controller D, please see related copending application Ser. No. 07/894,734, entitled "Disk Drive Controller with a Posted Write Cache Memory" to Dennis J. Alexander, Ryan A. Callison and Ralph S. Perry, filed concurrently herewith, which is hereby incorporated by reference. The disk array controller D is preferably placed on a separate adapter board for connection to an input/output (I/O) slot of a compatible host computer system (not shown). The disk array controller D has a local processor 30, preferably a V53 manufactured by NEC. The local processor 30 preferably uses an operating system referred to as the AMX Multi-tasking Real-time Executive by Kadak Corp., although the present invention is not limited to any particular operating system used by the local processor 30. The local processor 30 has address bus UA, data bus UD and control bus UC outputs. The data bus UD is connected to a transceiver 32 whose output is the local data bus LD. The address bus UA is connected to the inputs of a buffer 34 whose outputs are connected to the local data bus LD. The local processor 30 has associated with it random access memory (RAM) 36 coupled via the data bus UD and the address bus UA. The RAM 36 is connected to the processor control bus UC to develop proper timing signals. Similarly, read only memory (ROM) 38 is connected to the data bus UD, the processor address bus UA and the processor control bus UC. Thus the local processor 30 has its own resident memory to control its operation and for its data storage. A programmable array logic (PAL) device 40 is connected to the local processor control bus UC and the processor address bus UA to develop additional control signals utilized in the disk array controller D.

The local processor address bus UA, the local data bus LD and the local processor control bus UC are also connected to a bus master integrated controller (BMIC) 42. The BMIC 42 serves the function of interfacing the disk array controller D with a standard bus, such as the EISA or MCA bus and acting as a bus master. In the preferred embodiment the BMIC 42 is interfaced with the EISA bus and is the 82355 provided by Intel. Thus by this connection with the local processor buses UA and UC and the local data bus LD, the BMIC 42 can interface with the local processor 30 to allow data and control information to be passed between the host computer and the local processor 30.

Additionally, the local data bus LD and local processor control bus UC are connected to a transfer controller 44. The transfer controller 44 is generally a specialized, multichannel direct memory access (DMA) controller used to transfer data between the transfer buffer RAM 46 and the various other devices present in the disk array controller D. For example, the transfer controller 44 is connected to the BMIC 42 by the BMIC data lines BD and the BMIC control lines BC. Thus, over this interface the transfer controller 44 can transfer data from the transfer buffer RAM 46 through the transfer controller 44 to the BMIC 42 if a read operation is requested. If a write operation is requested, data can be transferred from the BMIC 42 through the transfer controller 44 to the transfer buffer RAM 46. The transfer controller 44 can then pass this information from the transfer buffer RAM 46 to a disk array A.

The transfer controller 44 includes a disk data bus DD and a disk address and control bus DAC. The disk data bus DD is connected to transceivers 48 and 50. The disk address and control bus DAC is connected to two buffers 64 and 66 which are used for control signals between the transfer controller 44 and the disk array A. The outputs of the transceiver 48 and the buffer 64 are connected to two disk drive port connectors 52 and 54. These port connectors 52 and 54 are preferably developed according to the integrated device electronics (IDE) interface standard utilized for hard disk units.

Two hard disks 56 and 58 can be connected to each connector 52 or 54. In a similar fashion, two connectors 60 and 62 are connected to the outputs of the transceiver 50 and the buffer 66. Thus in the preferred embodiment 8 disk drives can be connected or coupled to the transfer controller 44. In this way the various data, address and control signal can pass between the transfer controller 44 and the particular disk drives 56 and 58, for example.

A programmable array logic (PAL) device block 67 is connected to the disk address and control bus DAC and receives inputs from a control latch (not shown), which is utilized in the disk controller D to select which of the various disk channels the posted write memory 71 replaces. In the preferred embodiment, the transfer controller 44 provides 8 disk channels for data transfer. However, this presents a problem when 8 disk drives in the disk array A are actually utilized in addition to the posted write memory 71, all of which are coupled to the disk channel. To resolve this problem, the posted write memory 71 is designed to replace, on a selective basis, one of the actual disk units in the disk array A, without requiring the knowledge of this replacement by the transfer controller 44, so that then the local processor 30 need only indicate to the transfer controller 44 to use a particular selected device on the disk channel, with the replacement actually being made on the DAC bus itself. In this manner the transfer controller 44 need not be redesigned. However, if desired, it is of course understood that a ninth channel could be readily added to the transfer controller 44 to provide a specific channel for the posted write memory 71.

The PAL block 67 is used to map in the posted write cache memory 71 as a disk drive as indicated by the control latch and map out the actual disk drive. A transceiver 73 and a buffer 75 are connected to the disk data bus DD and the disk address and control bus DAC, respectively, to allow data and control information to be passed with the transfer controller 44.

In the preferred embodiment, a compatibility port controller (CPC) 64 is also connected to the EISA bus. The CPC 64 is connected to the transfer controller 44 over the compatibility data lines CD and the compatibility control lines CC. The CPC 64 is provided so that software which was written for previous computer systems which do not have a disk array controller D and its BMIC 42, which is addressed over a EISA specific space and allows very high throughputs, can operate without requiring rewriting of the software. Thus, the CPC 64 emulates the various control ports previously utilized in interfacing with hard disks. Although the preferred embodiment is implemented with the disk array A, it is understood that other disk drive configurations as known to those skilled in the art could be used instead.

Figure 2:
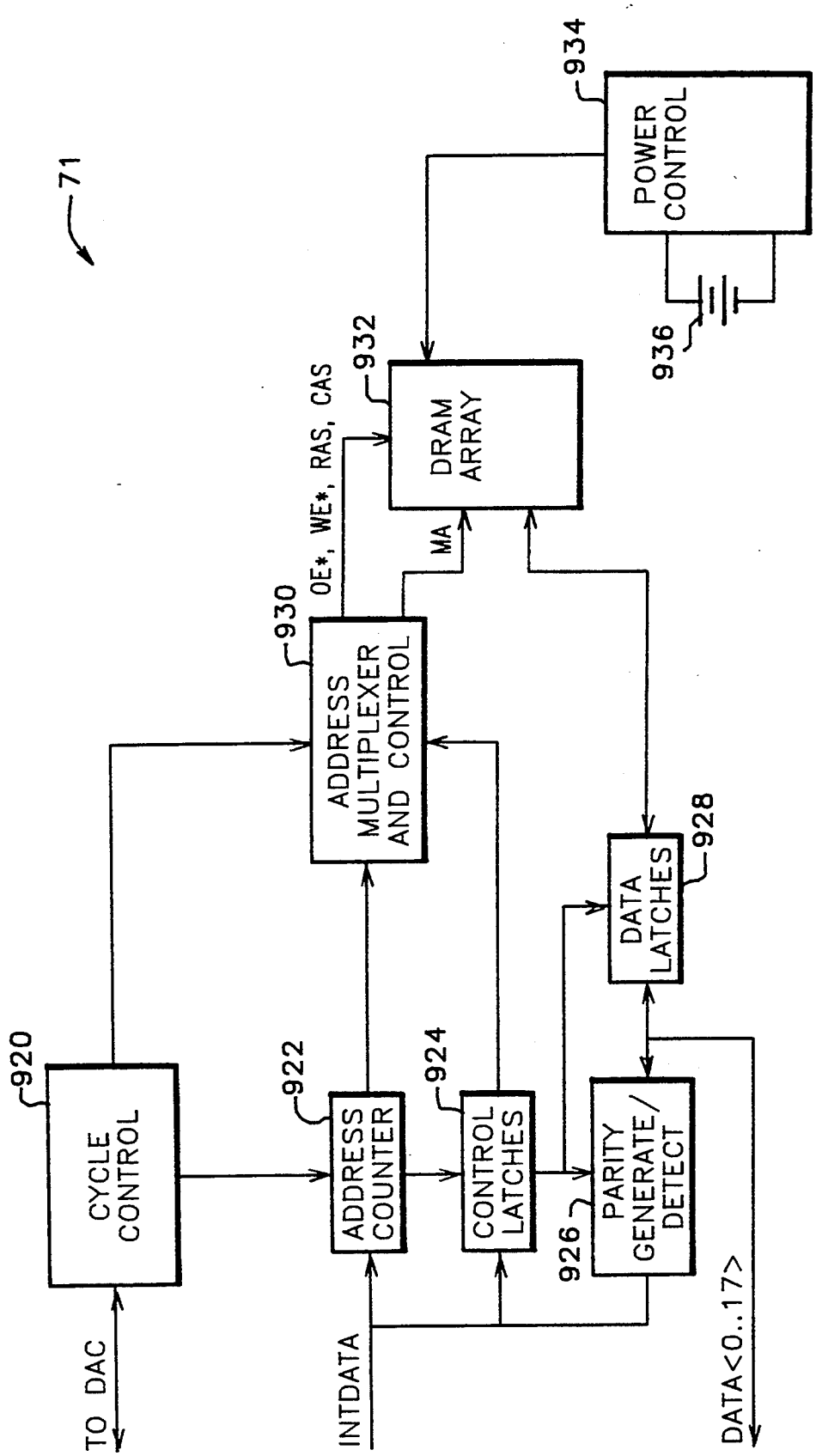
FIG. 2 is a block diagram of the posted write cache memory of FIG. 1.

Referring now to FIG. 2, a block diagram of the posted write cache memory 71 is shown. A cycle control block 920 receives the various signals from the buffer 75 which are provided from the DAC bus. These are the signals sufficient to determine if particular cycles, such as the data or command read/write cycles, are occurring and to return the various error, interrupt and other signals. The cycle control 920 provides outputs to an address counter 922, various control latches 924, a parity generator/detector transceiver 926 and to data latches 928. The address counter 922 is provided to allow latching and autoincrementing capabilities to allow operations with the transfer controller 44 to occur easily. The control latches 924 are provided to allow the local processor 30 to set various states and conditions of the posted write cache memory 71. The parity generator/detector transceiver 926 is used to provide the parity detection for write operations and to develop an internal data bus in the posted write cache memory 71 referred to as the INTDATA bus.

The devices address counter 922, control latches 924, and the parity generator/detector transceiver 926 are connected to the INTDATA bus. The outputs of the address counter 922 and of the control latches 924 are provided to an address multiplexer and control block 930. The address multiplexer and control block 930 also receives outputs from the cycle control 920. The address multiplexer and control block 930 provides the output enable (OE*), the write enable (WE*), row address select (RAS) and column address select (CAS) signals to a dynamic random access memory (DRAM) array 932 and provides the memory addresses to the DRAM array 932 over an MA bus. The data latches 928 provide the data to and from the DRAM array 932. The DRAM array 932 preferably is comprised of a mirrored bank of dynamic random access semiconductor memories which also include sufficient capacity for parity checking.

A power control block 934 is connected to a series of batteries 936 to provide battery power and to determine whether the batteries 936 or the power provided by the host computer system is provided to the DRAM array 932.

Figure 3:
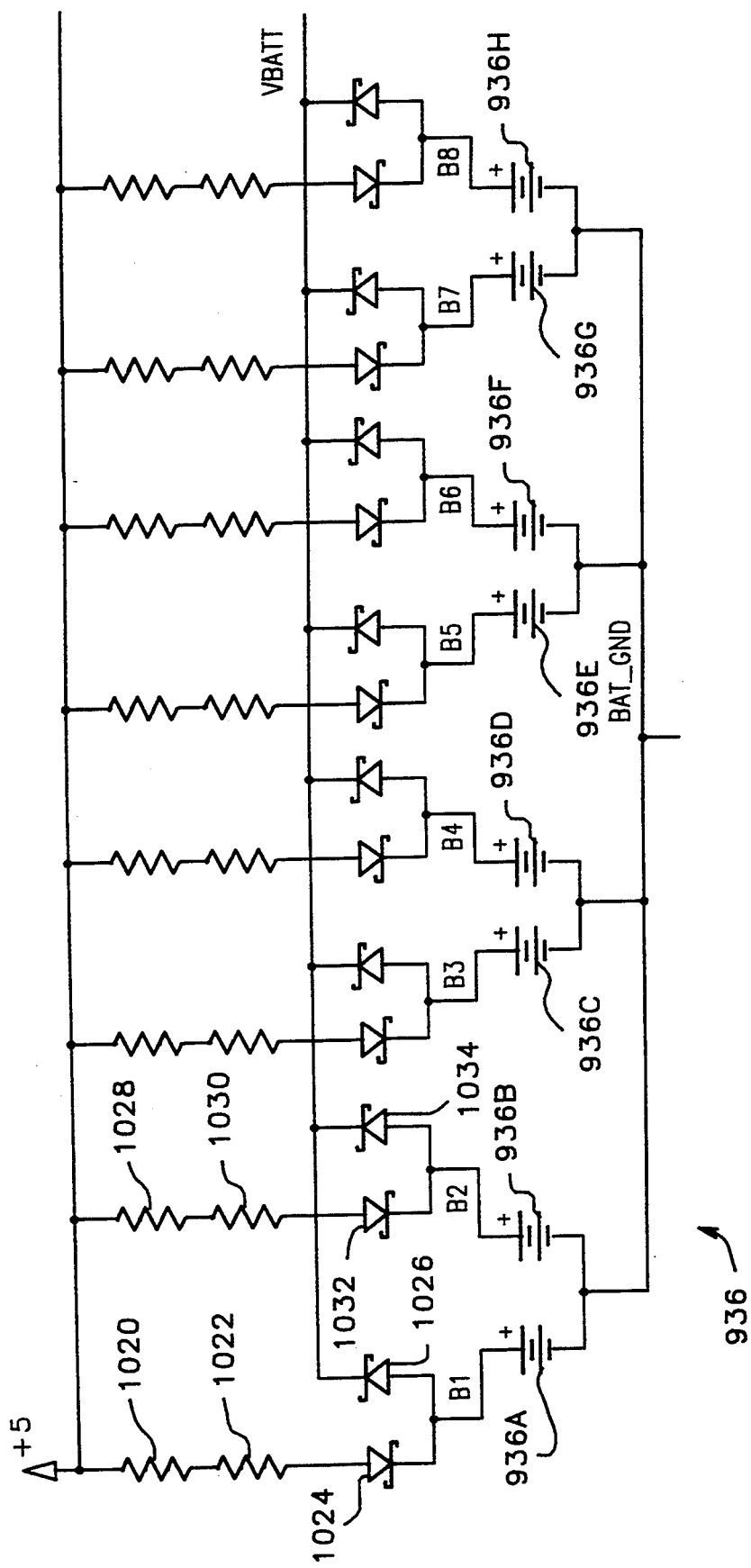
FIGS. 3-6 are schematic diagrams of portions of the power control circuitry of FIG. 2.

FIG. 3 shows the arrangement of the batteries 936. Preferably eight individual three volt lithium cells 936A–936H are utilized to form the battery 936. The ground or negative connections of the batteries 936A–936H are connected together to produce and develop a signal referred to as BAT_GND. Each of the positive terminals of the batteries 936A–936H is independent. Charge limiting resistors 1020 and 1022 are connected in series between a +5 volt supply and the anode of a Schottky diode 1024. The +5 volt supply is provided by the host computer when the disk array controller D is plugged into the host computer. The cathode of the diode 1024 is connected to the positive terminal of the battery 936A, this signal being referred to as the B1 signal. This path allows charging of the battery 936A. The anode of a Schottky diode 1026 is connected to the B1 signal and has its cathode connected to a signal referred to as VBATT. Similarly, charge limiting resistors 1028 and 1030 are connected between the +5 volt supply and the anode of a Schottky diode 1032, whose cathode is connected to the positive terminal of the battery 936B, which connection is referred to as the B2 signal. The B2 signal is connected to the anode of a Schottky diode 1034, whose cathode is connected to the VBATT signal. A similar arrangement of resistors and Schottky diodes is provided for the batteries 936C–936H, with the signals at the positive terminals of the batteries 936C–938H being the B3, B4, B5, B6, B7 and B8 signals, respectively.

Figure 4:
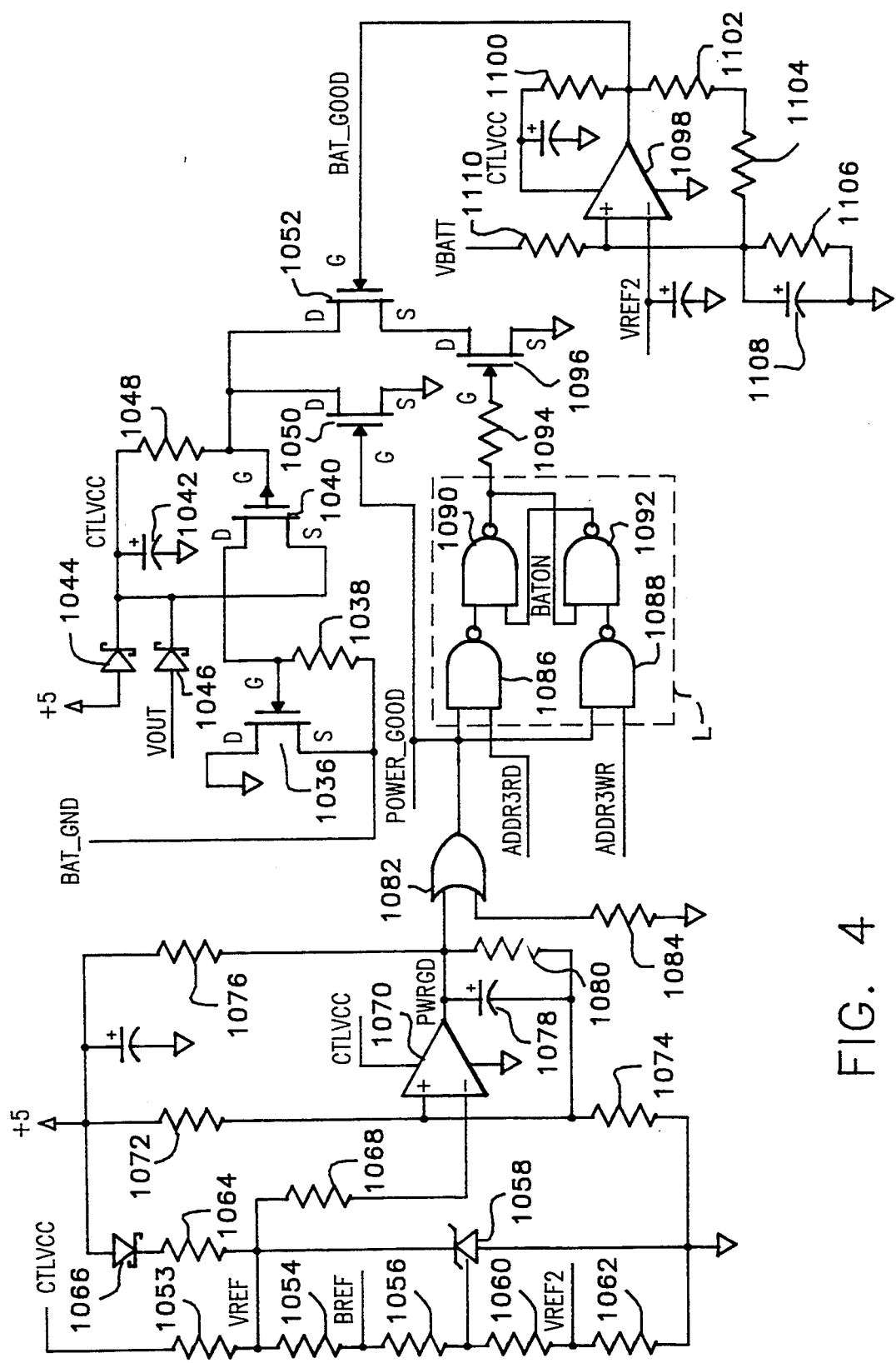

Referring now to FIG. 4, the BAT_GND signal is provided to the source of an N-channel enhancement MOSFET 1036 and to one terminal of a resistor 1038. The drain of the MOSFET 1036 is connected to ground, while the gate is connected to the second terminal of the resistor 1038 and to the drain of a P-channel enhancement MOSFET 1040. The source of the MOSFET 1040 is connected to a signal referred to as the CTLVCC or control logic VCC signal. The CTLVCC signal is connected to one terminal of a capacitor 1042, whose other terminal is connected to ground. The CTLVCC signal is connected to the cathodes of Schottky diodes 1044 and 1046. The anode of the diode 1044 is connected to the +5 volt supply, while the anode of the diode 1046 is connected to a signal referred to as VOUT. In this manner, the CTLVCC signal is provided in any event to allow power up of the system.

The CTLVCC signal is connected to one terminal of a resistor 1048 whose second terminal is connected to the gate of the MOSFET 1040 and the drains of N-channel enhancement MOSFETs 1050 and 1052. The source of the MOSFET 1050 is connected to ground, while the gate receives a signal referred to as POWER_GOOD which, when high, indicates that the +5 volt supply being received by the disk controller D is satisfactory. In this manner, when the POWER_GOOD signal is present, the MOSFET 1050 is activated, the MOSFET 1040 is activated and then the MOSFET 1036 is activated, so that the BAT_GND signal is effectively coupled to ground through the MOSFET 1036. This allows charging of the batteries 936 when the power is good.

The CTLVCC signal is provided to one terminal of a resistor 1053, whose second terminal produces a signal referred to as VREF, where the VREF signal is also connected to one terminal of a resistor 1054. The other terminal of the resistor 1054 produces a signal referred to as BREF, where the BREF signal is also connected to one terminal of a resistor 1056. The second terminal of the resistor 1056 is connected to the control input of a reference diode 1058 and to one terminal of a resistor 1060. The second terminal of the resistor 1060 produces a signal referred to as VREF2, where the VREF2 signal is also connected to one terminal of a resistor 1062. The second terminal of the resistor 1062 is connected to ground. The anode of the diode 1058 is connected to ground while the cathode is connected to the VREF signal. One terminal of a resistor 1064 is connected to the VREF signal and the other terminal is connected to the cathode of a Schottky diode 1066, whose anode is connected to the +5 volt supply.

A resistor 1068 receives at one terminal the VREF signal and has its second terminal connected to the inverting input of a comparator 1070. The non-inverting input of the comparator 1070 is connected between resistors 1072 and 1074, the second terminal of the resistor 1072 connected to the +5 volt supply and the second terminal of the resistor 1074 connected to ground. Thus, the resistors 1072 and 1074 provide a voltage divider, while the resistor 1068 provides a reference voltage to the comparator 1070. A resistor 1076 is connected between the +5 volt supply and the output of the comparator 1070 to act as a pull-up. The output of the comparator 1070 is also connected to the parallel combination of a capacitor 1078 and a resistor 1080, which act as a hysteresis feedback for the comparator 1070. The output of the comparator 1070 is further connected to one input of a two input OR gate 1082, whose second input is connected through a resistor 1084 to ground. The output of the OR gate 1082 is a signal referred to as POWER_GOOD. Thus, when the +5 volt supply reaches a level so that the divider signal provided to the comparator 1070 exceeds the reference voltage provided by the diode 1058, the power is considered good.

The POWER_GOOD signal is also provided as one input to a two input NAND gate 1086. The second input of the NAND gate 1086 receives a signal referred to as ADDR3RD. The POWER_GOOD signal is further connected to one input of a two input NAND gate 1088 whose second input is receives a signal referred to as ADDR3WR. The output of the NAND gate 1086 is provided as one input to a two input NAND gate 1090, while the output of the NAND gate 1088 is provided as one input to a two input NAND gate 1092. The output of the NAND gate 1090 is connected to the second input of the NAND gate 1092 and is referred to as the BATON signal, while the output of the NAND gate 1092 is connected to the second input of the NAND gate 1090. In this manner, the NAND gates 1086, 1088, 1090 and 1092 form a simple latch L which is set by a pulse to the ADDR3RD signal and cleared by a pulse to the ADDR3WR signal.

The local processor 30 may manipulate four address registers referred to as the address 0 register, the address 1 register, the address 2 register and the address 3 register by providing a command to the transfer controller 44 to read or write to the respective register. A command to read the address 3 register provides a pulse on the ADDR3RD signal and a command to write to the address 3 register provides a pulse on the ADDR3WR signal. Thus, the local processor 30 need only provide a command to the transfer controller 44 to read an address 3 register to set the BATON signal, and provide a write operation to the address 3 register to clear the BATON signal.

The BATON signal is used to provide a turn on circuit and grounding circuit to allow the batteries 936 to remain connected to ground and power the DRAM array 932 during times when the +5 volt supply is not being provided to the disk controller D. The output of the NAND gate 1090 is provided to one terminal of a resistor 1094, whose second terminal is connected to the gate of an N-channel enhancement MOSFET 1096. The source of the MOSFET 1096 is connected to ground while the drain is connected to the source of the MOSFET 1052. The gate of the MOSFET 1052 receives a signal referred to as the BAT_GOOD signal, which is provided by the output of a comparator 1098. When positive or high, the BAT_GOOD signal indicates that the battery voltage provided by the battery 936 is sufficient to enable the operation of the DRAM array 932. A resistor 1100 is connected between the output of the comparator 1098 and the CTLVCC signal to act as pull-up, while resistors 1102 and 1104 are connected in series between the output and the non-inverted input of the comparator 1098. A resistor 1106 is connected between the non-inverted input of the comparator 1098 and ground and is in parallel with a capacitor 1108. A resistor 1110 is connected between the non-inverted input of the comparator 1098 and the VBATT signal. The VREF2 signal is provided to the negative input of the comparator 1098.

In this manner, the comparator 1098 performs a determination as to whether the battery voltage being provided by the battery 936 is sufficient to power the DRAM array 932. If so, the BAT GOOD signal is high, so that the MOSFET 1052 is activated. Therefore, if the latch L is activated and if the +5 volts supply is removed so that the POWER_GOOD signal is no longer true, since the BAT_GOOD signal is active and the latch L has the BATON signal activated, then the voltage provided at the gate of the MOSFET 1040 is still ground and thus the batteries are still grounded through MOSFET 1036. Should, however, either the battery voltage be too low or the battery status be turned off, as indicated by the BATON signal being low, then one of the MOSFETs 1096 or 1052 is not active and thus the MOSFET 1040 is also not active. This, in turn, results in the MOSFET 1036 being turned off, so that the batteries 936 do not receive system ground and thus can not provide power to the DRAM array 932. This case is desirable to prevent the batteries 936 from discharging too deeply and to reduce discharging during certain power off conditions, particularly when dirty data is not present in the DRAM array 932 and it can be safely powered off.

Figure 5:
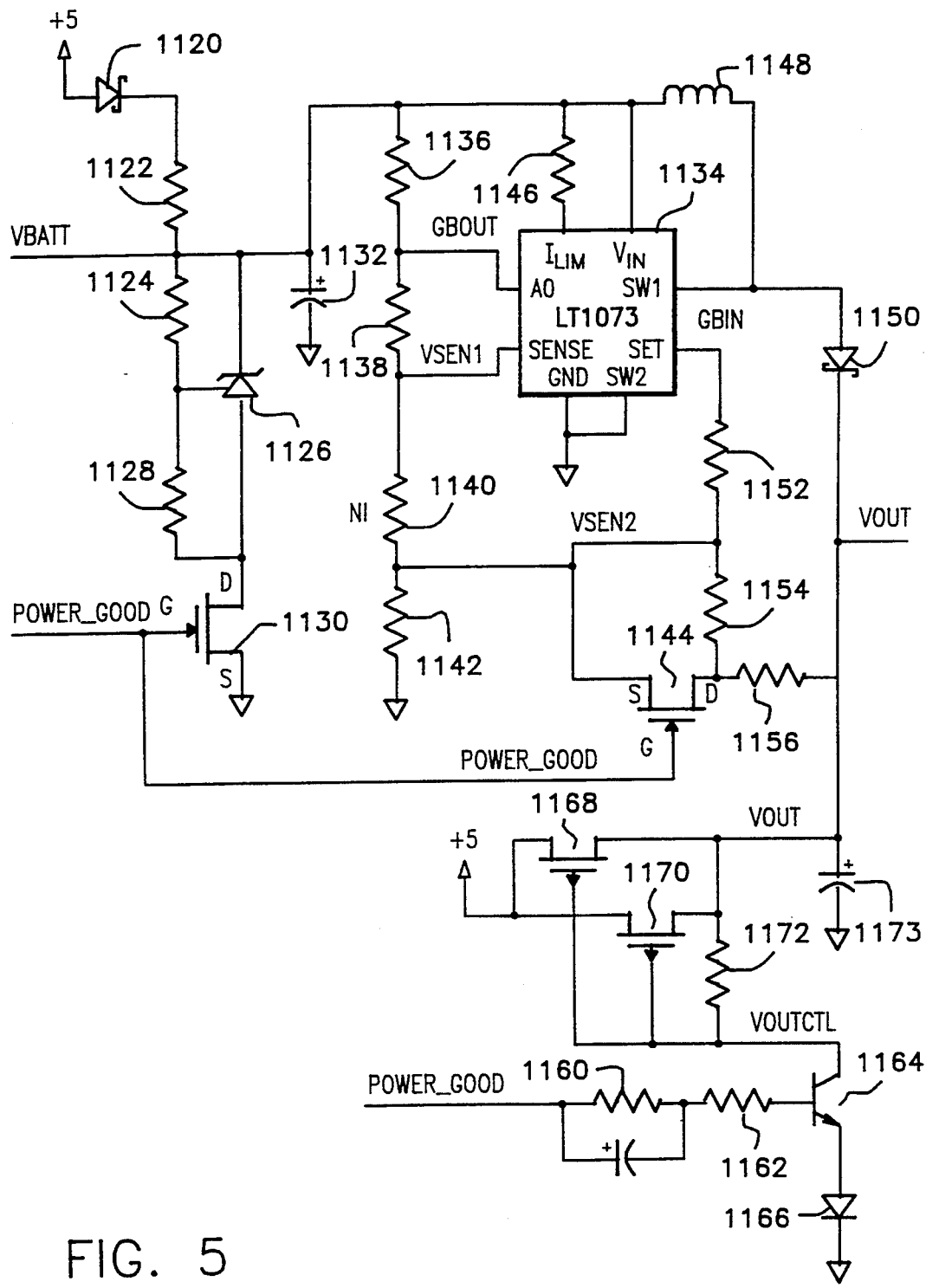

It is also necessary to develop the VOUT signal which is provided to the DRAM array 932 to power the memory cells. The development of this VOUT signal is shown in FIG. 5. A Schottky diode 1120 has its anode connected to the +5 volt supply and its cathode connected to one terminal of a resistor 1122. The second terminal of the resistor 1122 is connected to the VBATT signal and to one terminal of a resistor 1124. The second terminal of the resistor 1124 is connected to the control input of a voltage reference Zener diode 1126 and to one terminal of a resistor 1128. The anode of the Zener diode 1126 and the second terminal of the resistor 1128 are connected to the drain of an N-channel enhancement MOSFET 1130, whose source is connected to ground and whose gate receives the POWER_GOOD signal. The cathode of the diode 1126 is connected to the VBATT signal. Therefore, if the power is considered good, then the diode 1126 is active.

A switching voltage regulator 1134, preferably a Linear Technologies LT1073, is used to allow development of the VOUT signal from the VBATT signal if the power is not good. A capacitor 1132 is connected between the VBATT signal and ground. The VBATT signal is connected to a resistor 1136, whose second terminal is connected to the auxiliary gain block output of the switching regulator 1134 and to one terminal of a resistor 1138. The second terminal of the resistor 1138 is connected to the sense input of the switching regulator 1134 and to one terminal of a resistor 1140. The second terminal of the resistor 1140 is connected to the source of an N-channel enhancement MOSFET 1144, and to a resistor 1142, which has its second terminal connected to ground. A resistor 1146 is connected between the VBATT signal and the current limit input of the switching regulator 1134. An inductor 1148 is connected between the voltage input of the switching regulator 1134 and the switched output of the switching regulator 1134. The VBATT signal is also connected to the voltage input of the switching regulator 1134. The switched output of the switching regulator 1134 is also connected to the anode of a Schottky diode 1150, whose cathode is connected to the VOUT signal. A resistor 1152 has one terminal connected to the set input of the switching regulator 1134 and a second terminal connected to the source of the MOSFET 1144 and a first terminal of a resistor 1154. The second terminal of the resistor 1154 is connected to the drain of the MOSFET 1144 and to one terminal of a resistor 1156. The second terminal of the resistor 1156 is connected to the VOUT signal to provide voltage feedback. The gate of the MOSFET 1144 is connected to the POWER_GOOD signal.

The VOUT signal can be developed directly from the +5 volt supply. The POWER_GOOD signal is provided to one terminal of the resistor 1160. The second terminal of the resistor 1160 is connected to the first terminal of a resistor 1162, whose second terminal is connected to the base of an NPN transistor 1164. The emitter of the transistor 1164 is connected to the anode of a diode 1166 whose cathode is connected to ground. The collector of the transistor 1164 is connected to the gates of two P-channel enhancement MOSFETs 1168 and 1170 and to one terminal of a resistor 1172. The second terminal of the resistor 1172 is connected to the VOUT signal and to the sources of the MOSFETs 1168 and 1170, whose drains are connected to the +5 volt supply. The sources of the MOSFETs 1168 and 1170 are also connected to the VOUT signal and to one terminal of a capacitor 1173, whose second terminal is connected to ground. In this manner, if the power is good so that the POWER_GOOD signal is true or active, the transistor 1164 is turned on so that a low voltage is applied to the gates of the MOSFETs 1168 and 1170, which then are turned on so that the +5 volt supply is transmitted directly to the VOUT signal to power the DRAM array 932.

If the +5 volt supply is good so that the POWER_GOOD signal is true, the MOSFETs 1126 and 1036 are on so that the diode 1126 regulates the VBATT signal preferably at approximately 3 volts, providing a maximum voltage of approximately 3.25 volts across each battery 936A–936H. The MOSFET 1144 is activated, shorting out the resistor 1154, so that the switching regulator 1134 regulates its switched output as would be measured at VOUT to preferably less than 5 volts, preferably to approximately 4.7 volts. Since the transistor 1164 is on activating the MOSFETs 1168 and 1170, the +5 volt supply is provided to the VOUT signal to power the DRAM array 932, whereas the diode 1150 is biased off, isolating the switched output of the switching regulator from the VOUT signal. Note that even if the BATON and BAT_GOOD signals are high, the batteries 936 are not providing power to the DRAM array 932 so that the batteries 936 are essentially in a standby mode in case the primary power fails causing the POWER_GOOD signal to go false.

If the BATON and BAT_GOOD signals are high and if the power is not good so that the POWER_GOOD signal is false, the MOSFETs 1130 and 1144 are off so that the switched output of the switching regulator 1134 is preferably regulated at approximately 5 volts at VOUT. Also, the MOSFETs 1168 and 1170 are switched off by the transistor 1164, so that the +5 volt supply is isolated from the VOUT signal, and the diode 1150 is forward biased so that the batteries 936 through the switching regulator 1134 provides power to the DRAM array 932 through the VOUT signal. Finally, if the POWER_GOOD signal is false and if either the BATON or BAT_GOOD signals are false, the switching regulator is not activated so that the batteries 936A–936H are not drained into the DRAM array 932.

Figure 6:
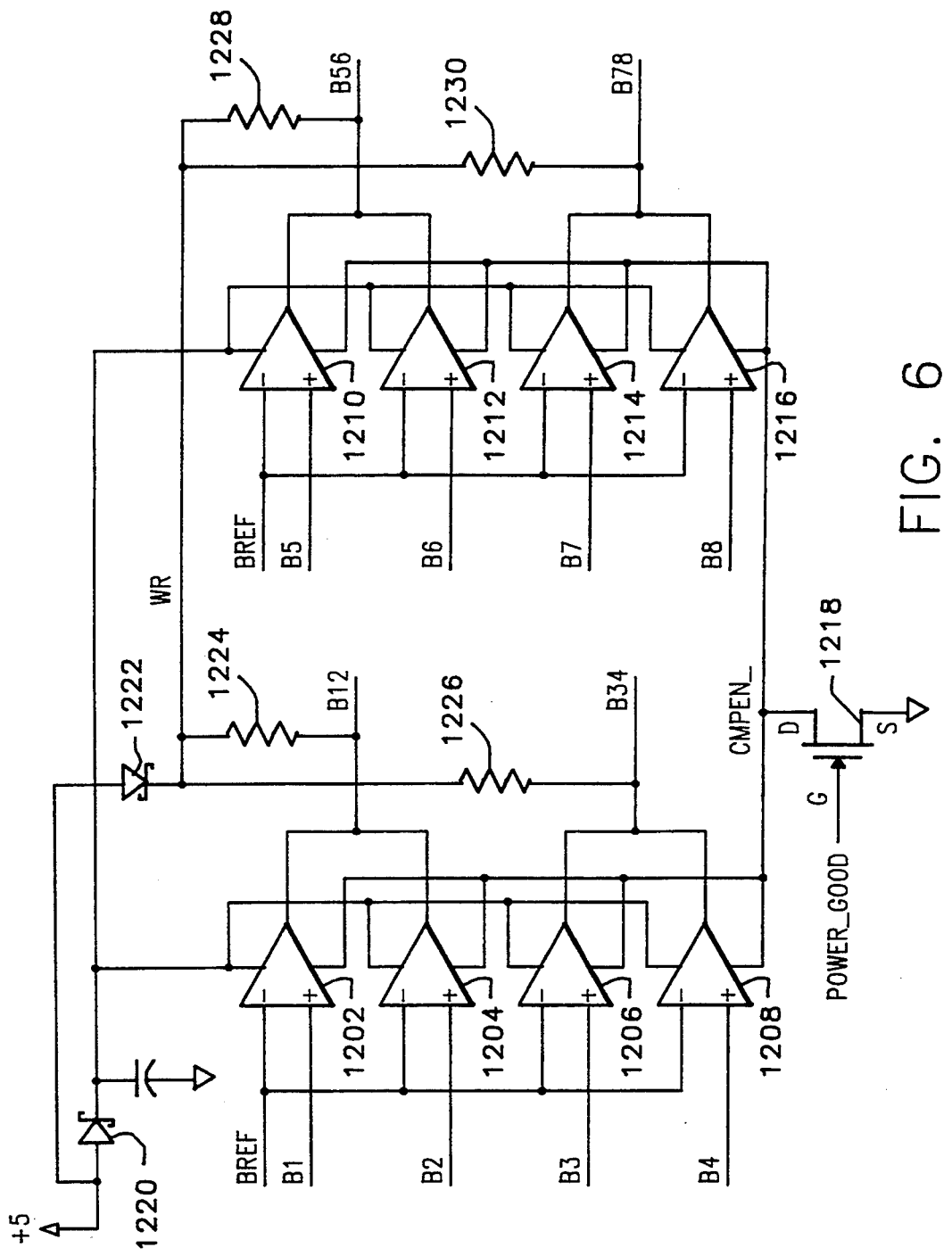

It is also desirable to monitor the status of the batteries 936 so that the local processor 30 can determine if and when the battery cells 936A–936H go bad or low. The circuit is shown in FIG. 6. The BREF signal is provided to the inverting inputs of a series of comparators 1202, 1204, 1206, 1208, 1210, 1212, 1214 and 1216. The ground terminals of the comparators 1202–1216 are connected to the drain of an N-channel enhancement MOSFET 1218, whose source is connected to ground and whose gate receives the POWER_GOOD signal. The power terminals of the comparators 1202–1216 are connected to the cathode of a Schottky diode 1220 whose anode is connected to the +5 volt supply. The +5 volt supply is also provided to the anode of a Schottky diode 1222, whose cathode is used to develop a pull up signal for the outputs of the comparators 1202-1216. The non-inverting input of the comparator 1202 receives the B1 signal, while the non-inverting input of the comparator 1204 receives the B2 signal. In a similar fashion, the comparators 1206-1216 receive at their non-inverting inputs the B3, B4, B5, B6, B7 and B8 signals, respectively. In this manner, the comparators 1202-1216 are used to compare each of the individual batteries 936A-936H with a reference voltage to determine if any of them are going bad or if their charge levels are going too low.

The outputs of the comparators 1202 and 1204 are connected together and to one terminal of a resistor 1224 and provide a signal referred to as the B12 signal to the address 2 register. Similarly, the outputs of the comparators 1206 and 1208 are connected together and are pulled up to the diode 1222 by a resister 1226 and provide a signal referred to as the B34 signal, which is also provided to the address 2 register. Similarly, the outputs of the comparators 1210 and 1212 are connected together to produce a signal referred to as the B56 signal, which is pulled up by a resistor 1228 to the diode 1222. Finally, the comparators 1214 and 1216 have their outputs connected together to produce a signal referred to as the B78 signal, which is pulled up by a resistor 1230 to the voltage of the diode 1222. The B56 and B78 signals are provided to the address 2 register for possible reading by the local processor 30 via the transfer controller 44. For purposes of this disclosure, the address 2 register will hereinafter be referred to below as the battery status register. Thus, the local processor 30 can retrieve the B12, B34, B56 and B78 signals by commanding the transfer controller 44 to read the battery status register.

The host computer executes a power on self test (POST) routine when it powers up which initializes the host computer, checks for hardware and software errors, establishes appropriate data structures and informs the user of any errors. The host computer also retrieves any warning messages provided by the disk array controller D through the host computer system ROM protocol at POST, and relays these warning messages to the user of the host computer. The host computer preferably includes a device driver which generates command lists to read from and write to the disk array A.

Figure 9A:
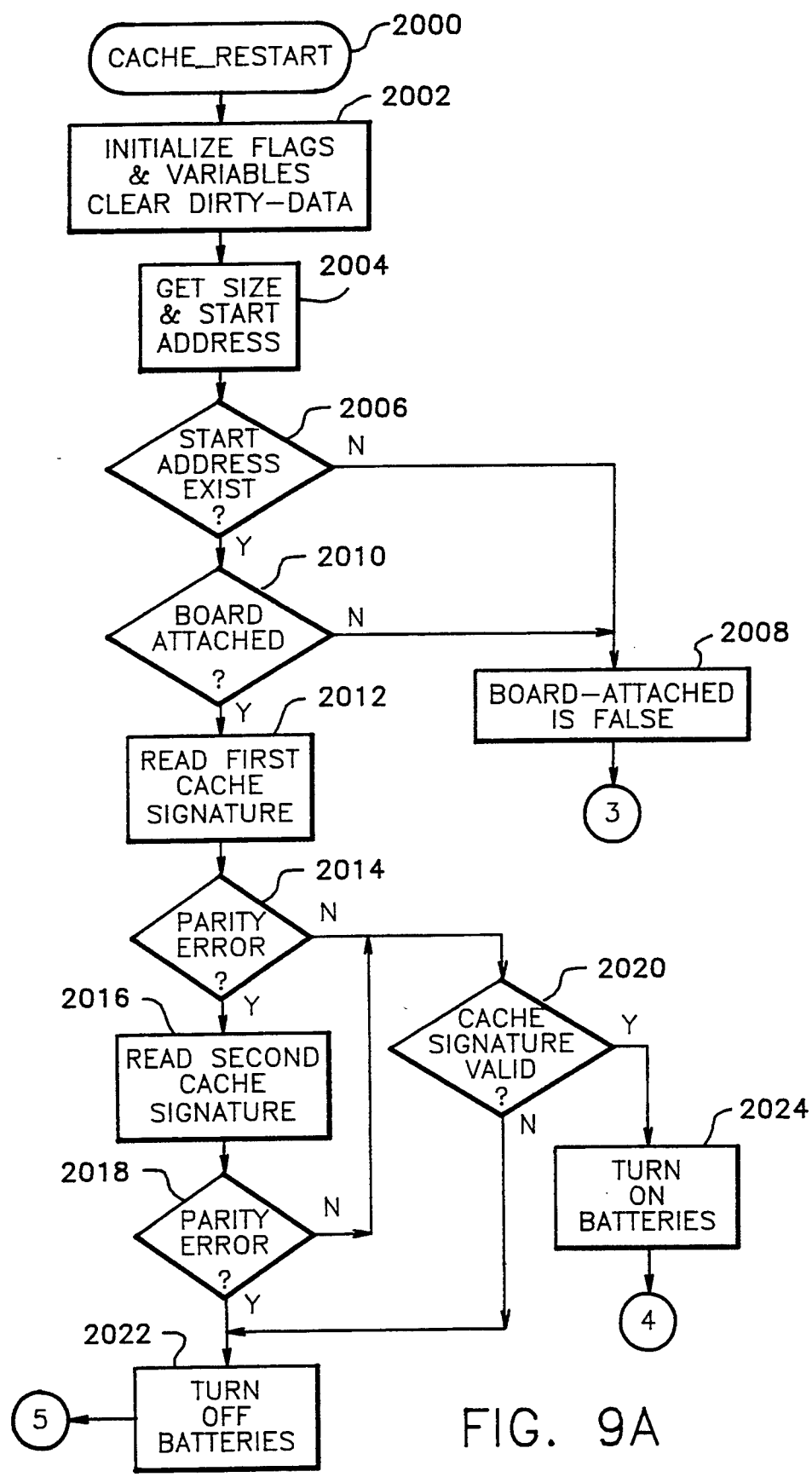
FIGS. 9A-9F show flow charts illustrating steps performed according to the present invention to determine if valid dirty data exists within the posted write cache memory of FIG. 1 upon power-up.
Figure 9B:
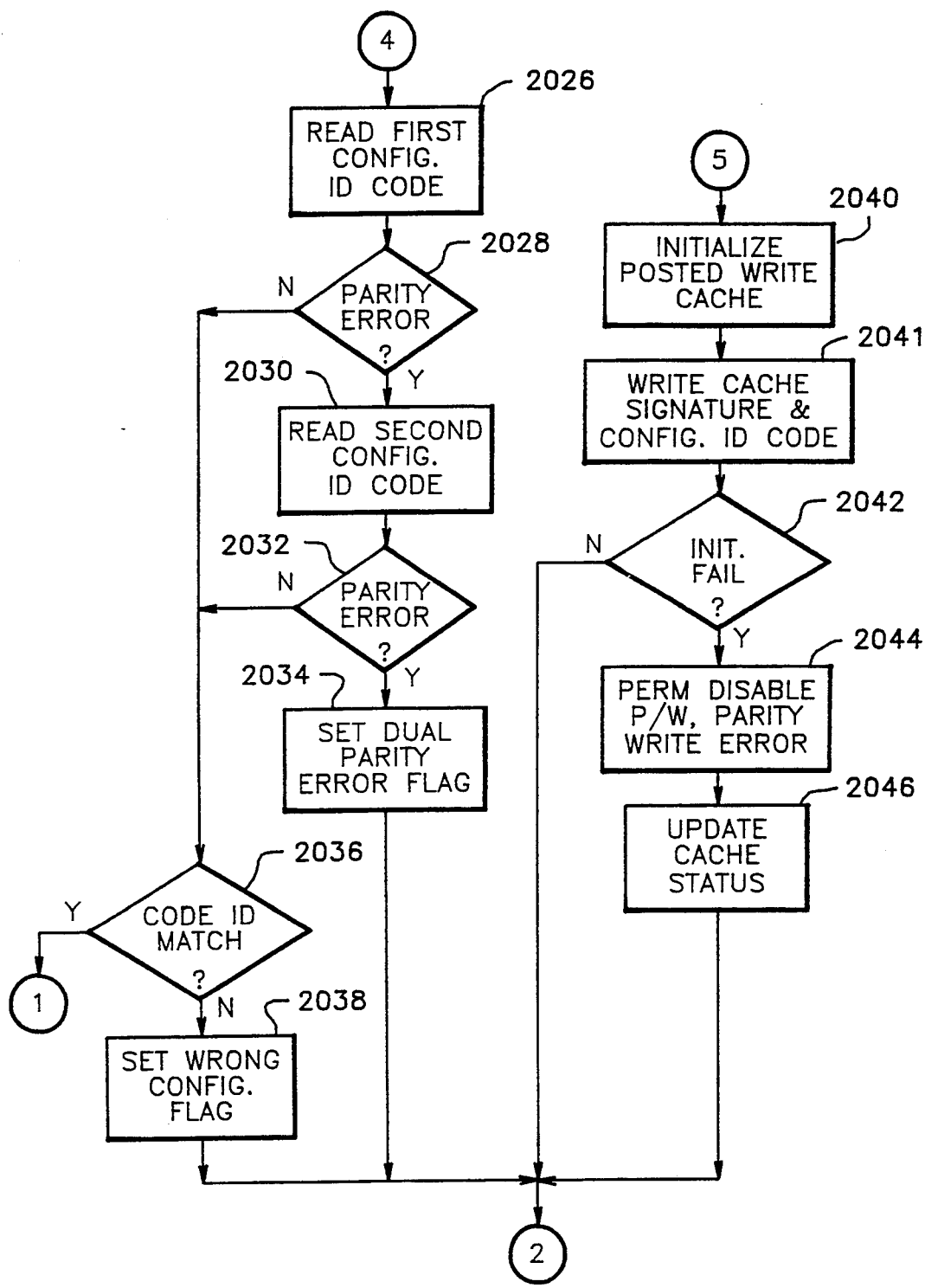
Figure 9C:
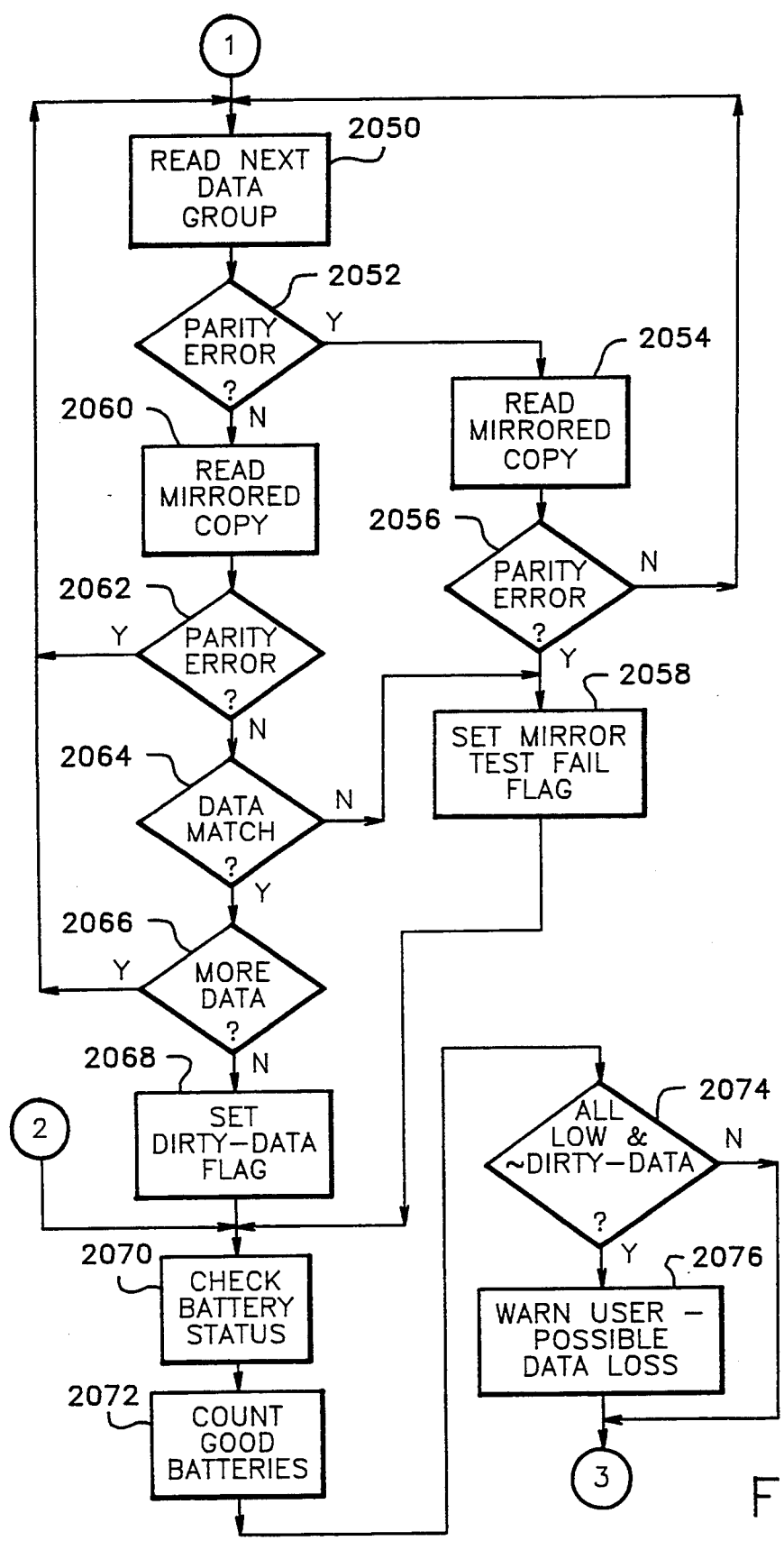

The power up and initialization of the posted write cache memory 71 will be described in a little more detail below and in steps 2040 (FIG. 9A) and 2092 (FIG. 9C). For now, once it is determined that the posted write cache memory 71 is attached to the proper host computer and operating properly, it is initialized by the local processor 30 to enable posted write operations, which generally means that data from the host computer intended to be written to the disk array A may be temporarily stored in the posted write cache memory 71 before being transferred or flushed to the disk array A. Also, if the host computer needs to read data from the disk array A that also resides and is valid on the posted write cache memory 71, the data is read from the posted write cache memory 71 rather than from the disk array A for proper and quicker data retrieval. Posted write operations may be temporarily or permanently disabled if certain errors occur, and these errors will also be described.

If the posted write cache memory 71 is attached and operating properly and posted write operations are enabled, a cache signature and a configuration identification code are written into the posted write cache memory 71 at certain predefined address locations. The cache signature is written as part of the initialization sequence, if not already present, as described below. The cache signature is preferably a predetermined ASCII (American Standards Committee on Information Interchange) string several characters in length. The posted write cache memory 71 is preferably in a mirrored configuration so that two copies of the cache signature are actually written to the posted write cache memory 71, a first copy to the regular data area and a second mirrored copy to the mirrored data area. The configuration identification code preferably comprises four bytes of random data generated by the host computer, which is then transferred to the local processor 30 and written both to the disk array A and the posted write cache memory 71. The configuration identification code is part of configuration data stored in the disk array A by the local processor 30. Upon power up of the disk array controller D, the local processor 30 reads the disk array A to retrieve the configuration data including the configuration identification code. If the configuration data does not exist, the user is informed through the host computer system ROM protocol at POST. The user can run an initialization routine through the device driver on the host computer which generates the configuration data including the configuration identification code. Again, since the posted write cache memory 71 is preferably mirrored, two copies of the configuration identification code are written to the posted write cache memory 71.

Figure 7:
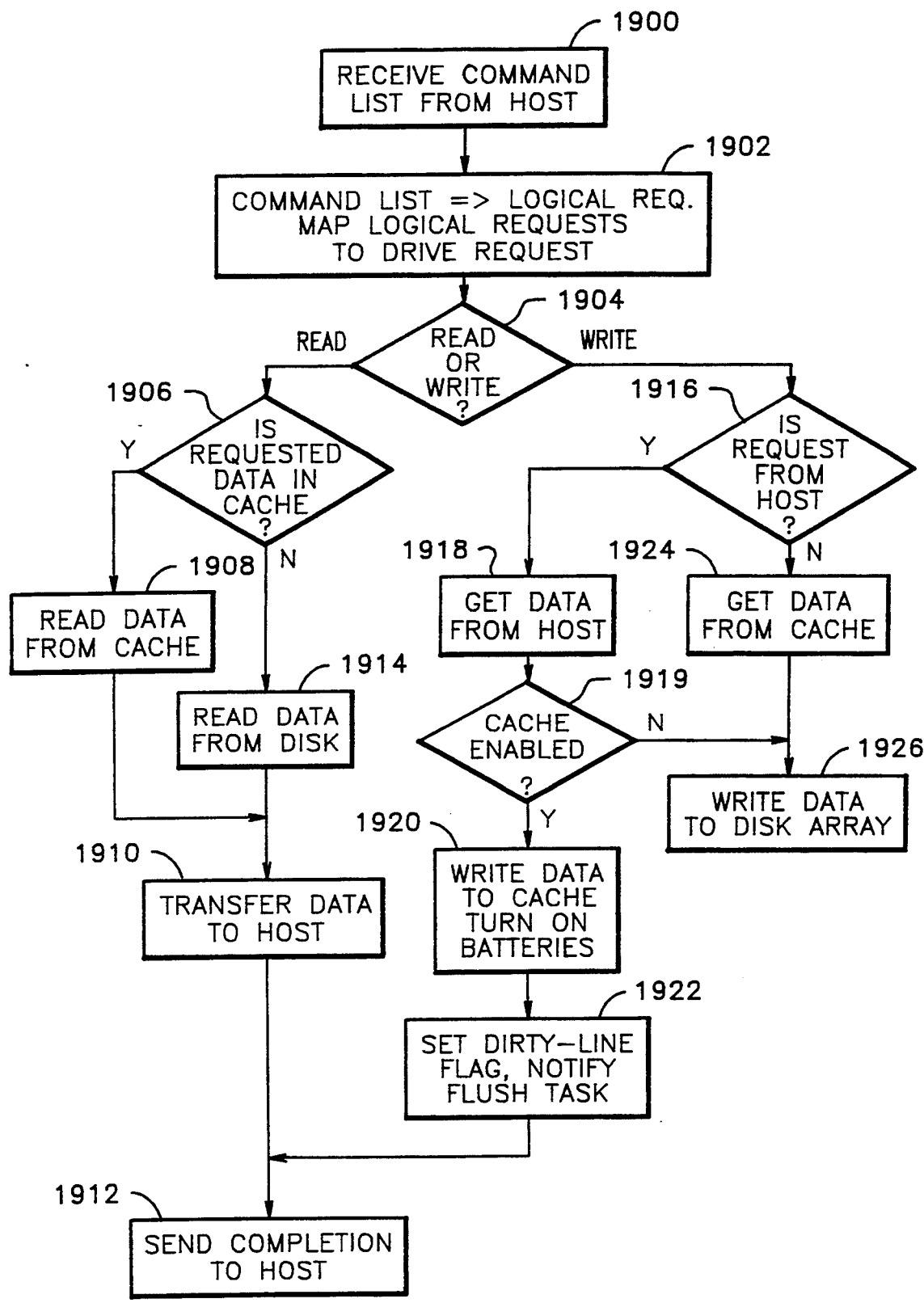
FIG. 7 shows a flow chart illustrating a procedure to write data to and read data from the posted write cache memory of FIG. 1.

Referring now to FIG. 7, a flow chart is shown generally illustrating a procedure according to the present invention to write data to and read data from the posted write cache memory 71. The process is described below is greatly simplified and many details are omitted as not being significant for purposes of this disclosure. For more details, please see related copending application Ser. No. 07/894,067, entitled "Posted Write Disk Array System" to Randy D. Schneider and David L. Flower, filed concurrently herewith, which is hereby incorporated by reference. Beginning in step 1900, the local processor 30 receives a command list from the host computer, where the command list comprises read and write commands to and from the disk array A. Operation then proceeds to step 1902 where the local processor 30 parses the command list into one or more logical requests. Logical requests are also generated by a flush task (FIG. 8), described below, which searches and consolidates dirty data within the posted write cache memory 71. A task referred to as the mapper task examines the logical requests and organizes the logical requests into a plurality of physical drive requests for the individual drives, including the posted write cache memory 71. The mapper task also checks to see if the posted write cache memory 71 is full and, if so, the mapper task disables write posting for logical requests that are smaller than a given size and enables posting for logical requests greater than a given size.

Once the mapper task has broken up the logical requests into a plurality of individual drive requests, a task referred to as scheduler examines each drive request, marking each request as a read hit, read miss, posted write, or disk array write. A read hit means that the data can be retrieved from the posted write cache memory 71 rather than the disk array A, which occurs in step 1908. Otherwise, the data must be read from the slower disk array A, which occurs in step 1914, indicating a read miss. A posted write indicates the data is to be written to the posted write cache memory 71, which occurs in step 1920, and a disk array write means that the data is to be written directly to the disk array A, which occurs in step 1926. The scheduler task then splits up the drive requests into individual drive queues for each of the drives, including the posted write cache memory 71, and initiates transfer of the read and write requests.

A task referred to as DRV handles post processing of each of the drive requests, such as status information updates in the posted write cache memory 71. The DRV task is also responsible for initiating the remaining transfers after the scheduler task has initiated the requests. It is noted that any time data is written to the posted write cache memory 71, status information including address "tags" is also stored indicating the status and location of any data residing in the posted write cache memory 71. The posted write cache memory 71 preferably includes a plurality of lines where each line corresponds to 16 sectors of a respective drive in the disk array A. The status information is stored in a reserved area and includes a plurality of 16 bit words forming a bit map providing information about each of the sectors comprising a line. Preferably, one 16 bit word per line is used to determine whether each of the sectors are dirty. The status information also includes a pointer to the location of the data within the posted write cache memory 71 and a tag comprising the upper bits of the address of the data representing a data "page" to which the data belongs. Dirty data indicates that the data was written to the posted write cache memory 71 but has not yet been copied, or flushed to the disk array A.

Operation proceeds to step 1904 from step 1902 where it is determined whether each disk request is a read or a write request. If it is a read request, operation proceeds to step 1906 where it is determined whether the requested data resides in the posted write cache memory 71. If so, operation proceeds to step 1908 where the data is read from the posted write cache memory 71 and operation proceeds to step 1910 where the data is transferred to the host computer. Operation then proceeds to step 1912 where a completion indication is sent to the host computer. If the requested data is not in the posted write cache memory 71 in step 1906, operation instead proceeds to step 1914 where the data is read from the disk array A, and then operation proceeds to step 1910 where the data is transferred to the host computer.

Referring back to step 1904, if the request is a write request, operation proceeds to step 1916 where it is determined whether the request originated from the host computer or from the flush task. If it is a host computer request, operation proceeds to step 1918 where the data is retrieved from the host computer. Operation then proceeds to step 1919 where it is determined whether posted write operations or the posted write cache memory 71 is enabled. A POSTED-WRITES-ENABLED flag is set or cleared as described below upon power up and periodically thereafter. If the POSTED-WRITES-ENABLED flag is cleared, posted write operations are disabled and operation proceeds to step 1926 where the data is written directly to the disk array A rather than the posted write cache memory 71. Otherwise, if posted write operations are enabled, operation proceeds to step 1920 where the data is written into the posted write cache memory 71 and the batteries 936 are switched "on" or into standby mode by providing a positive pulse on the ADDR3RD signal. The latch L subsequently asserts the BATON signal high. Operation then proceeds to step 1922 where the flush task routine is "notified" and a flag referred to as the DIRTY-LINE flag is set indicating that dirty data exists in the posted write cache memory 71. The flush task, described more fully below, has a relatively low priority compared to other tasks or routines running on the local processor 30. The flush task will run constantly if dirty data is continually being written to the posted write cache memory 71. However, once the posted write cache memory 71 is flushed of all dirty data, the flush task exits, but it is called again in step 1922 if not already running. Operation then proceeds to step 1912 where the completion indication is sent.

Referring back to step 1916, if the request is not from the host computer, operation proceeds to step 1924 where the data is retrieved from the posted write cache 71. From step 1924 or from step 1919 if posted write operations are disabled, operation proceeds to step 1926 where the data is written to the disk array A. When data is flushed from the posted write cache memory 71 in steps 1924 and 1926, the lines being flushed are locked or otherwise marked, as indicated in the status information, so that these data lines are not read or written to until the flushing operation is completed. The status information of the transferred data is also updated at this time indicating that this data in the posted write cache memory 71 has been flushed and is no longer dirty. As described below, however, the batteries 936 are not switched off at this time since the request does not necessarily flush all of the dirty data.

Figure 8:
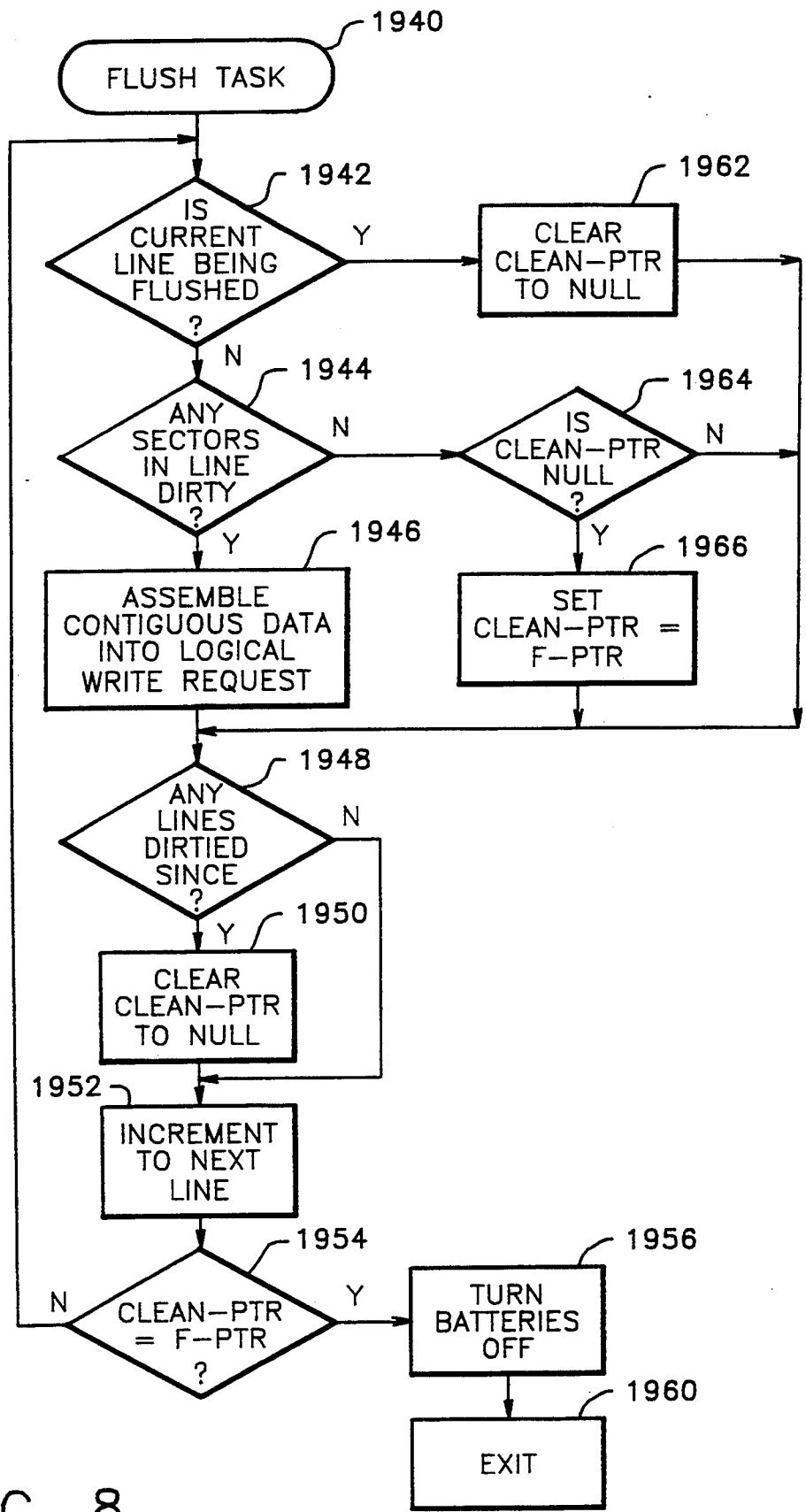
FIG. 8 shows a flow chart illustrating a flush procedure according to the present invention to determine if dirty data resides in the posted write cache memory of FIG. 1 during normal operations, and if so, to consolidate the dirty data for flushing.

Referring now to FIG. 8, a flow chart is shown illustrating a task referred to as the flush task which continually scans through the posted write cache memory 71 searching for dirty data to flush to the disk array A, consolidates contiguous dirty data if found and generates write requests to flush the dirty data. Again, the flush task is simplified greatly to include only those steps relevant to the present disclosure and many details are omitted for clarity. In general, the flush task searches the posted write cache 71 line by line for dirty data to flush, and uses several pointers to accomplish its operations. One pointer, referred to as the F-PTR pointer, points to the current line being examined. Another pointer, referred to as the CLEAN_PTR pointer, is set to point to the current line when the flush task finds that line is clean, that is, does not contain dirty data. The CLEAN_PTR pointer is cleared or set to null whenever any line is dirtied in the posted write cache memory 71 while the flush task is operating, regardless of which line is dirtied. Therefore, if the flush task traverses through the entire posted write cache memory 71 and back to the position of the CLEAN-PTR pointer and the CLEAN-PTR pointer is not set to null, then the flush task knows that the posted write cache memory 71 contains no dirty data.

The AMX operating system calls the flush task when dirty data needs to be flushed, and operation is then transferred to step 1940. Operation then proceeds to step 1942 where the F-PTR pointer is retrieved and the flush task checks the status information to determine if the current line is presently being flushed. Recall that when data is flushed from the posted write cache memory 71 in steps 1924 and 1926, the lines being flushed are locked or otherwise marked to indicate they are being flushed to prevent access to these lines. If the current line is not currently being flushed, operation proceeds to step 1944 where the status information of the current line is checked to determine if any sectors within the current line contain dirty data. If the current line contains dirty data in step 1944, operation proceeds to step 1946 where the dirty data is retrieved from the current line and combined with other contiguous dirty data. A logical write request is then generated.

It is noted that in step 1946, the flush task preferably combines or coalesces partial stripe writes into full stripe writes and generates logical requests similar to a single write or read command list created by the host computer. Flush logical requests created by the flush task are processed through the mapper, scheduler, and DRV tasks in a manner similar to that of a host computer generated command. In this way, the number of actual operations to the drive array A is reduced, resulting in greater system efficiency. In step 1946, the mapper task is called if a logical request is generated, where the mapper task has a higher priority than the flush task. Thus, if a logical request to flush contiguous dirty data is generated in step 1946 and the mapper task is called, the logical request is very likely to be performed before the flush task resumes.

Operation proceeds to step 1948 from step 1946 where the DIRTY-LINE flag is checked to determine if any lines within the posted write cache memory 71 have been dirtied since step 1948 was last performed. Any time this step is performed, the DIRTY-LINE flag is cleared. If the DIRTY-LINE flag was set in step 1922, operation proceeds to step 1950 where the CLEAR-PTR pointer is cleared, indicating dirty data still exists in the posted write cache memory 71. From step 1950, operation proceeds to step 1952 where the F-PTR pointer is incremented to point to the next data line. If no lines were dirtied in step 1948 since this step was last performed, operation proceeds directly to step 1952 from step 1948. From step 1952, operation proceeds to step 1954 where the CLEAN-PTR pointer is compared to the F-PTR pointer. If the CLEAR-PTR pointer is not equal to the F-PTR pointer in step 1954, then the entire posted write cache memory 71 has not yet been checked for dirty data and operation loops back to step 1942. If the pointers are equal in step 1954, then the posted write cache memory 71 contains no more dirty data and operation proceeds to step 1956 where the batteries 936 are turned off or switched out of standby mode. Note also that the DIRTY-LINE flag will be cleared in step 1948 indicating no dirty data in the posted write cache memory 71. Again, in step 1956, the local processor 30 provides a pulse on the ADDR3WR signal to clear the BATON signal provided by the latch L. Operation then proceeds to step 1960 where the flush task routine is completed, until called again by the local processor 30.

Referring back to step 1942, if the current line is presently being flushed, operation proceeds to step 1962 where the CLEAN-PTR pointer is cleared since dirty data possibly still exists in the posted write cache memory 71. Operation then proceeds to step 1948 from step 1962. Referring back to step 1944, if there are no dirty sectors in the current line, operation proceeds to step 1964 where the CLEAN-PTR pointer is checked to see if it is cleared. If the CLEAN-PTR is cleared in step 1964, operation proceeds to step 1966 where the CLEAN-PTR pointer is set to point to the current line since the current line does not contain dirty data. Operation then proceeds to step 1948 from step 1966. If the CLEAR-PTR pointer is not clear in step 1964, operation proceeds directly to step 1948 from step 1964.

FIGS. 9A–9D show flow charts illustrating steps performed by firmware running on the local processor 30 to determine if valid dirty data exists within the posted write cache memory 71 upon power-up of the host computer. The AMX operating system first performs some preliminary steps including reading configuration information from the disk array A which includes the configuration data and the configuration identification code. The local processor 30 also determines from the configuration data if posted write operations were previously activated on the disk array A, and if so, the appropriate data structures used for posted write operations.

Referring now to FIG. 9A, the local processor 30 executes a cache restart procedure beginning at a cache restart step 2000. If any errors are detected by the cache restart procedure as further described below, warnings are sent to the user through the system ROM protocol at POST. The cache restart procedure is executed even if posted write operations are supposed to be inactive as determined by the configuration data. From step 2000, operation proceeds to an initialization step 2002 where flags and variables are initialized and interrupts are enabled. The DIRTY-DATA flag is initially set to false. Operation then proceeds to step 2004 where the start address and size of the posted write cache memory 71 is determined. In the preferred embodiment, the posted write cache memory 71 is approximately 4 Mbytes of data implemented as 2 Mbytes of mirrored memory where each data byte is copied in a physically different RAM chip residing on the daughter board. Operation then proceeds to step 2006 where it is determined whether the start address exists. If the start address does not exist, it is assumed that the posted write cache memory 71 is not attached, and operation proceeds to step 2008 where a BOARD-ATTACHED flag is set to false. Operation then proceeds to step 2080 (FIG. 9D), described below.

If the start address does exist in step 2006, operation proceeds to step 2010 where the posted write cache memory 71 is further checked to verify that it is present and plugged into the disk array controller D. To do this, a certain register located within the CPC 64 located on the disk array controller D is read. A signal on the CPC 64, accessible through the register, is normally pulled high through a pull-up resistor when the posted write cache memory 71 is not attached. This signal is grounded by the posted write cache memory 71 when it is plugged in. If the posted write cache memory 71 is not present in step 2010, operation proceeds to step 2008. Otherwise, the BOARD-ATTACHED flag is set true since the posted write cache memory 71 is present and operation proceeds to step 2012.

In step 2012, the first cache signature is read from the posted write cache memory 71 to determine if dirty data exists. The cache signature remains in the posted write cache memory 71 only if the battery was on during a power failure or if a warm-boot was executed so that primary power remained un-interrupted, although the disk array controller D is reset. Operation then proceeds to a step 2014 where it is determined if a parity error occurred while reading the first cache signature. If a parity is detected in step 2014, operation proceeds to step 2016 where the second, mirrored copy of the cache signature is read from the posted write cache memory 71. Operation then proceeds to step 2018 where it is determined if a parity error occurred while reading the second cache signature. If so, operation proceeds to step 2022, described below, where it is deemed that the cache signature does not exist. If the cache signature does not exist, it indicates that dirty data does not reside in the posted write cache memory 71 upon power up. If a parity error is not detected in either steps 2014 or 2018, operation proceeds to step 2020 where the cache signature is compared to the predetermined ASCII string to verify its validity. If the cache signature is not valid as determined in step 2020, data does not exist on the posted write cache memory 71 and operation proceeds to step 2022.

If the cache signature is valid in step 2020, operation proceeds to step 2024 where the batteries 936 are turned on by the local processor 30, as described above, to assure the dirty data is not lost in case of a subsequent primary power failure. Operation then proceeds to step 2026 where the first configuration identification code is read from the posted write cache memory 71. Operation proceeds to step 2028 which determines if a parity error occurred while reading the first configuration identification code in step 2026. If a parity error is detected in step 2028, operation proceeds to step 2030 where the mirrored version of the configuration identification code is read from the posted write cache memory 71. Operation then proceeds to step 2032 which determines if a parity error was detected while reading the second configuration identification code in step 2030. If a parity error is detected in step 2032, operation proceeds to step 2034 where a DUAL-PARITY-ERROR flag is set true indicating that a software error has occurred. Operation then proceeds to step 2070 (FIG. 9B), described below. As will be described below, a dual parity error results in permanent disablement of posted write operations since the software is not operating properly.

If a parity error is not detected while reading the first or second configuration identification codes in steps 2028 or 2032, operation proceeds to step 2036 where the configuration identification code read from the posted write cache memory 71 is compared with the configuration identification code previously read from the disk array A. If the configuration identification codes do not match in step 2036, operation proceeds to step 2038 where a WRONG-CONFIGURATION-SIGNATURE flag is set true indicating that the wrong posted write cache memory 71 is plugged onto the disk controller D and very likely contains dirty data intended for another host computer. As will be described below, posted write operations are eventually temporarily disabled and the user is notified of the problem through the system ROM protocol at POST. The user can override this error condition by reinitializing the posted write cache memory 71. Operation then proceeds to step 2070.

Referring back to step 2020, if the cache signature does not match in step 2020, or if it cannot be read as determined in step 2018, operation proceeds to step 2022 where the batteries 936 are turned off by the local processor 30 since dirty data does not reside in the posted write cache memory 71. Operation then proceeds to step 2040 where the posted write cache memory 71 is physically initialized by clearing all of its data locations. The posted write cache memory 71 is then read to verify that all locations have been cleared. Operation then proceeds to step 2041 where the configuration identification code from the disk array A as well as the cache signature are rewritten into proper locations on the posted write cache memory 71. Operation then proceeds to step 2042 which determines if the initialization procedure performed in step 2040 failed for any reason. If so, operation proceeds to step 2044 where a PARITY-WRITE-ERROR flag is set to true indicating a permanent disable condition. Operation then proceeds to step 2046 where an update cache status routine is executed. Anytime an update cache status step is encountered, operation is transferred to step 2120 (FIG. 9D) where a plurality of error flags are checked and posted write operations are temporarily or permanently disabled if an error is found. A disable code is also defined to identify the error. The update cache status routine will be further described in detail below. After the update cache status routine is completed, operation is transferred back to the point of departure and resumed. If the initialization does not fail as determined in step 2042, or after the update cache status routine completes in step 2046, operation proceeds to step 2070.

Referring back to step 2036, if the configuration identification codes from the posted write cache memory 71 and from the disk array A match, operation proceeds to step 2050 (FIG. 9B). Beginning in step 2050, since dirty data has been determined to reside within the posted write cache memory 71, a mirror test is initiated which compares all of the data with its mirrored copy to ensure that the dirty data residing in the posted write cache memory 71 is valid. The data is preferably compared 32 sectors at a time, where each sector is preferably 512 bytes for a total of 16 Kbytes per group. Every time step 2050 is performed, the very next group of dirty data is read until all of the dirty data residing in the posted write cache memory 71 is read, as determined in step 2066.

Operation then proceeds to step 2052 from step 2050 where it is determined whether a parity occurred during the read operation in step 2050. If a parity error is detected in step 2052, operation proceeds to step 2054 where the mirrored version of the data group is read and the data group read in step 2050 is essentially ignored. Operation proceeds to step 2056 to determine if a parity error occurred while reading the mirrored version of the group of data in step 2054. If a parity error is detected in step 2056, operation proceeds to step 2058 where a MIRROR-TEST-FAIL flag is set to true indicating that a hardware error has occurred since data can not be read from the posted write cache memory 71. Operation proceeds from step 2058 to step 2070. If a parity error does not occur in step 2056, the mirrored version of the data group is considered valid although it is not compared with the original data group read in step 2050. Operation then proceeds back to step 2050 where the following data group is read.

Referring back to step 2052, if a parity error was not detected, operation proceeds to step 2060 where the mirrored version of the data group is read. Operation proceeds to step 2062 where it is determined whether a parity occurred while reading the next mirrored data group in step 2060. If a parity is detected in step 2062, the mirrored version of the data group is ignored and it is assumed that the original data group is valid, so that operation proceeds back to step 2050 to read the following data group. If a parity error is not detected in step 2062, operation proceeds to step 2064 where the data group is compared with its mirrored version to determine if they match. If the data does not match in step 2064, operation proceeds to step 2058, as described above, where the mirror data test fails and the MIR- ROR-TEST-FAIL flag is set. If the data group and its mirrored version match in step 2064, operation proceeds to step 2066 where it is determined whether there is another data group to be read. If the mirror test is not completed in step 2066, operation loops back to step 2050. Otherwise, operation proceeds to step 2068 where the DIRTY-DATA flag is set to true since dirty data exists in the posted write cache memory 71. It is noted, however, that it is possible that the cache signature is present although no dirty data is present in the posted write cache memory 71. This case is handled below.

Operation proceeds to step 2070 from steps 2068, 2058, 2034, 2038, 2046 or 2042, if appropriate, where the battery status register is read to determine the charge status of the batteries 936. As described previously, the battery status register is read by the transfer controller 44 as commanded by the local processor 30 to retrieve the B12, B34, B56 and B78 signals to determine the charge status of the batteries 936A–936H, respectively. From step 2070, operation proceeds to step 2072 which counts how many of the B12, B34, B56 and B78 signals are high. The total number of true signals is a number from 0 to 4 indicating the amount of battery power available. Operation then proceeds to step 2074 which queries whether all the batteries 936A–936H are low and if the DIRTY-DATA flag is false. If all the batteries 936A–936H are low and if the DIRTY-DATA flag is false, operation proceeds to step 2076 indicating a possible data loss situation where the user is warned with a message through the system ROM protocol at POST. If step 2076 is executed, it is very likely that the batteries 936 were severely drained while attempting to maintain dirty data buffers in the posted write cache memory 71 after primary system power was removed, but were unable to do so. The user is warned although it is understood that there is no possibility of retrieving the data. Otherwise, the batteries 936 were merely drained due to extended storage and an otherwise normal power up situation exists. This condition is considered unlikely as the storage life of the preferred batteries at full charge is approximately one year. If at least one bit of the battery status register is true or if the DIRTY-DATA flag is true in step 2074, or after step 2076 is performed, operation proceeds to step 2080.

Referring now to FIG. 9C, several permanent history flags are monitored in step 2080 and corresponding current permanent disable flags are set to maintain the permanent disable status. In the preferred embodiment, if any permanent posted write cache memory 71 disable flags were previously set before the last power down, they were saved in the configuration data stored on the disk array A before the power loss. This permanent disablement history is not the same as the current permanent disable flags since power up but is instead a copy of the permanent flags from the previous powered session. Thus, the user is unable to bypass a permanent disable condition of a posted write cache memory 71 unless the user reconfigures the disk array A to remove the permanent history information. Of course, if a subsequent permanent error occurs upon power up these flags are again set.

Operation proceeds to step 2084 from step 2080 where the size of the current posted write cache memory 71, as determined in step 2004, is compared to the size stored in the configuration data. If the memory sizes do not match, operation proceeds to step 2086 where a NOT-ENOUGH-MEMORY flag is set indicating that insufficient memory exists on the posted write cache memory 71. This may indicate that an incorrect posted write cache memory 71 is attached or that one or more RAM chips are defective. After step 2086, or if the memory size is proper in step 2084, operation proceeds to step 2088 where the update cache status routine is executed. Upon return from the update cache status routine in step 2088, operation proceeds to step 2090 where if valid configuration data existed on the disk array A and if there are no permanent disable conditions previously set, operation proceeds to step 2092. In step 2092, the variables and data structures used for posted write operations are initialized.

Operation then proceeds to step 2094 which determines if any errors occurred in the initialization in step 2092. If errors are not detected in step 2094, operation proceeds to step 2096 where the DIRTY-DATA flag is checked. If the DIRTY-DATA flag is true in step 2096, operation proceeds to step 2098 where the posted write cache memory 71 is scanned to find the location of all the dirty sectors in the posted write cache memory 71. This step executes a separate routine which returns a flag indicating whether dirty data was found. Operation then proceeds to step 2100 which queries whether any dirty data was found in the posted write cache memory 71.

It is possible for the DIRTY-DATA flag to be set without dirty data actually residing in the posted write cache memory 71 if a warm boot of the computer is executed. Thus, if dirty data is not actually found in step 2100, operation proceeds to step 2102 where the DIRTY-DATA flag is cleared and the batteries 936 are turned off. If the DIRTY-DATA flag is false in step 2096, or if dirty data was found in step 2100, or if there is no configuration data or a permanent disable condition exists in step 2090, or after step 2102 is performed, operation proceeds to step 2104 where the update cache status routine is executed. If the initialization performed in step 2092 fails as determined in step 2094, operation proceeds to step 2106 where the disk array A configuration data is set to null so that posted write operations are eventually disabled. Operation then proceeds to step 2104 from step 2106. After execution of the update cache status routine in step 2104, the cache restart routine is exited as indicated by step 2108.

Figure 9D:
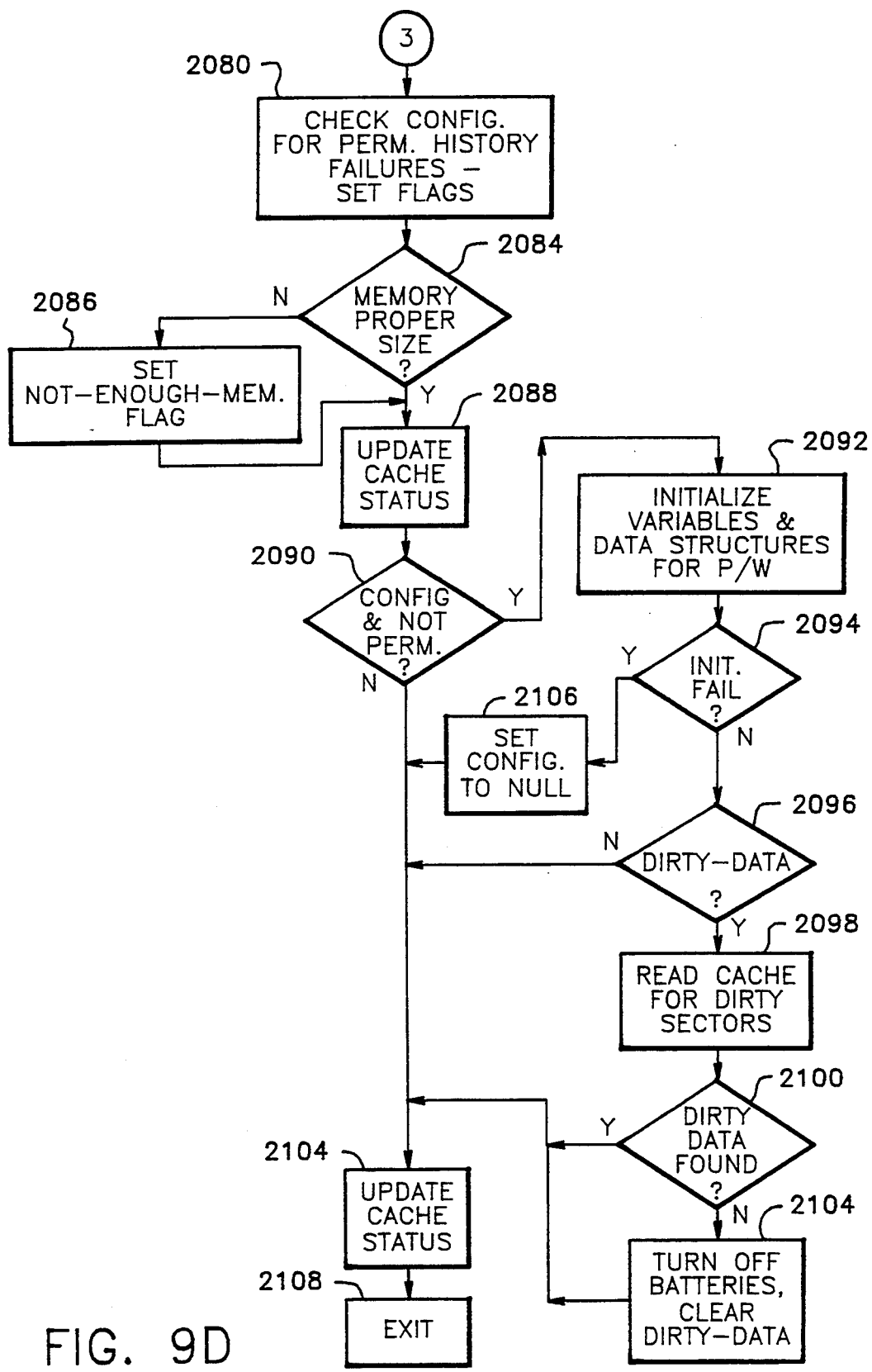
Figure 9E:
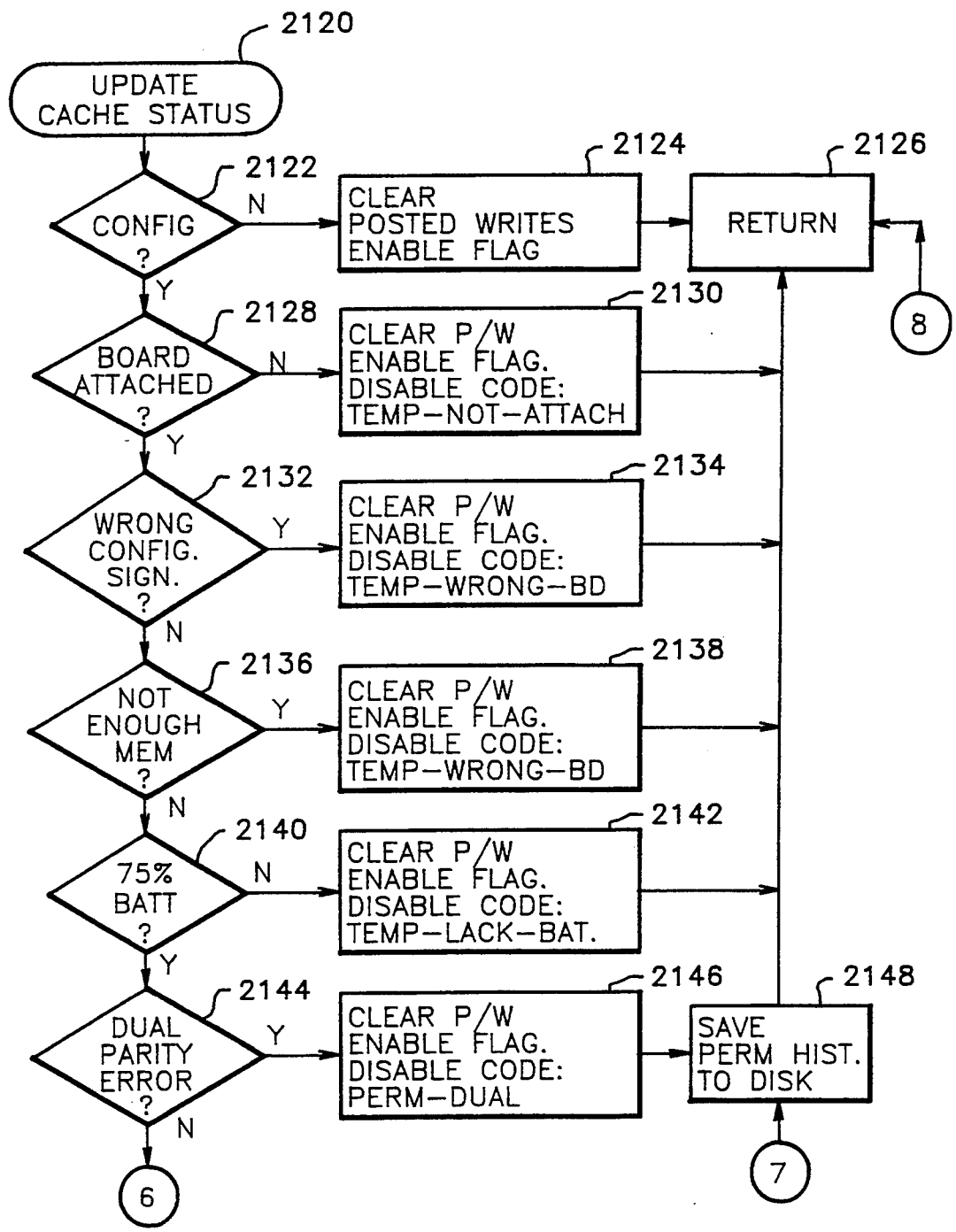
Figure 9F:
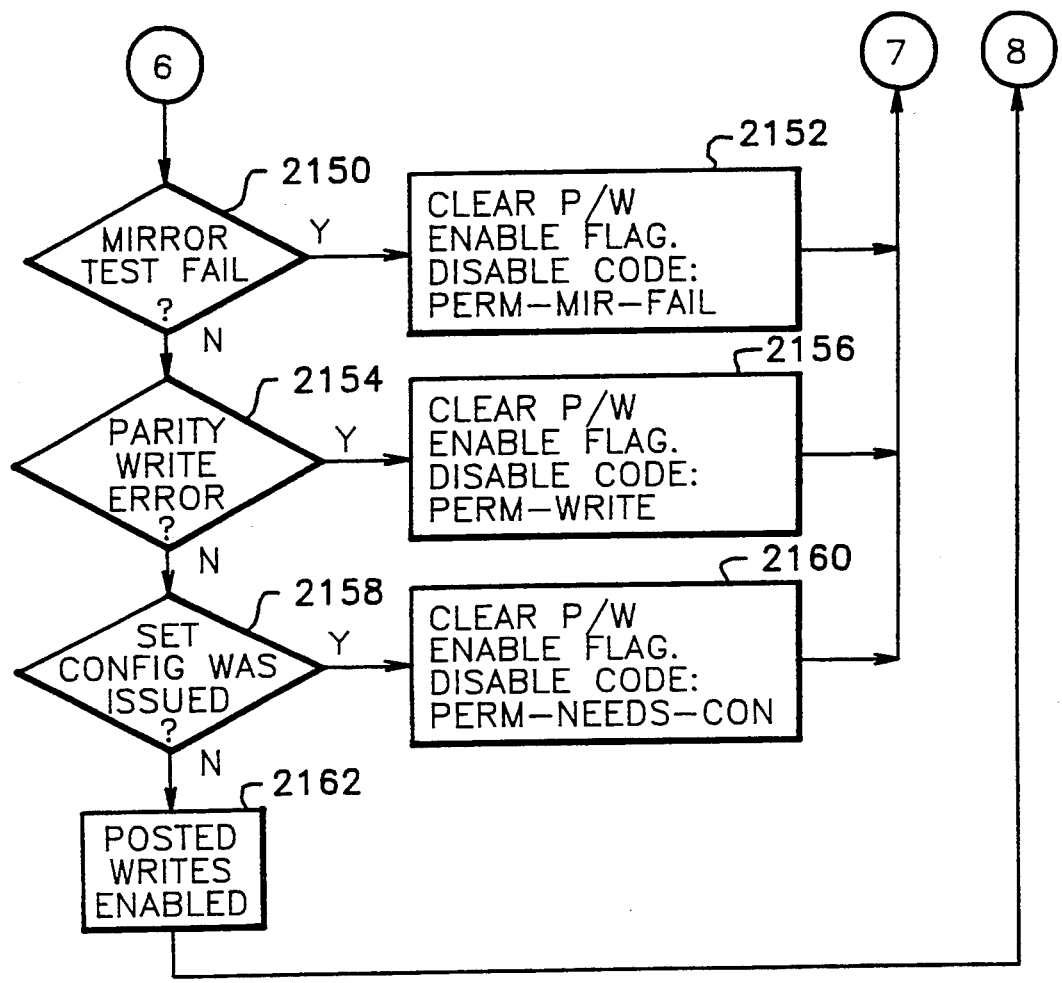

Referring now to FIG. 9D, each time the update cache status step is encountered, operation transfers to step 2120. The cache update status routine monitors a plurality of error flags and updates the POSTED-WRITES-ENABLED flag accordingly. Also, a disable code is defined which can be read by the local processor 30 to determine which error has occurred. After the cache restart routine is completed, the update cache status routine is preferably executed by the local processor 30 approximately once every minute to update the flags as necessary.

From step 2120, operation proceeds to step 2122 which determines if configuration data exists on the disk array A. If not, operation proceeds to step 2124 where the POSTED-WRITES-ENABLED flag is set to false indicating that posted write operations are disabled. From step 2124, the update cache status routine is exited as indicated by step 2126 which returns control to the point where the update cache status routine was called. If the configuration data exists in step 2122, operation proceeds to step 2128 where the BOARD-ATTACHED flag is tested to determine if the posted write cache memory 71 is attached. If the BOARD-ATTACHED flag is false in step 2128, operation proceeds to step 2130 which clears the POSTED-WRITES-ENABLED flag and defines the disable code as "TEMP-NOT-ATTACHED" which identifies the error condition. In this case, posted write operations are temporarily disabled until the posted write cache memory 71 is attached, removing the error condition. Operation then proceeds to step 2126 and the update cache status routine is exited.

If the posted write cache memory 71 is attached in step 2128, operation proceeds to step 2132 where the WRONG-CONFIGURATION-SIGNATURE flag is tested which is previously set if the configuration identification codes between the posted write cache memory 71 and the disk array A do not match. If the WRONG-CONFIGURATION-SIGNATURE flag is true in step 2132, operation proceeds to step 2134 where the POSTED-WRITES-ENABLED flag is set false and the disable code is defined as "TEMP-WRONG-BOARD." This is a temporary error condition which is removed when the proper posted write cache memory 71 is installed. From step 2134, operation proceeds to step 2126. If the WRONG-CONFIGURATION-SIGNATURE flag is false in step 2132, operation proceeds to step 2136 where the NOT-ENOUGH-MEMORY flag is tested. If the NOT_ENOUGH_MEMORY flag is true, operation proceeds to step 2138 where the POSTED-WRITES-ENABLED flag is set false and the disable code is set to "TEMP-WRONG-BOARD." Again, this is a temporary error condition which is removed if corresponding posted write cache memory 71 with the proper amount of memory is attached. From step 2138, operations proceeds to step 2126.

If the NOT-ENOUGH-MEMORY flag is false in step 2136, operation proceeds to step 2140 which determines if the battery power is at least 75% of full power. This is determined by comparing the good battery count with the number three wherein if the good battery count is at least three, then the battery power is at least 75% of full power. If not enough battery power is available in step 2140, it indicates a temporary disable condition and operation proceeds to step 2142 where the POSTED-WRITES-ENABLED flag is set to false until the batteries 936 are charged to the proper level. The disable code is preferably set to "TEMP-LACK-BATTERY", indicating a temporary posted waits disable condition due to lack of battery power. Operation then proceeds to step 2126 from step 2142.

If all of the tests pass in steps 2122, 2128, 2132, 2136 and 2140, operation proceeds to step 2144 where the DUAL-PARITY-ERROR flag is tested to determine if a dual parity error previously occurred. If so, operation proceeds to step 2146 where the POSTED-WRITES-ENABLED flag is cleared and the disable code is defined ad "PERM-DUAL-SOFT-ERROR" indicating a permanent software error condition. Operation then proceeds to step 2148 where the permanent disable condition is saved to the disk array A. Operation then exits in step 2126. As described previously, permanent error conditions are saved to the disk array A and cannot be removed unless the user reformats the disk array A.

If a dual parity error has not occurred as tested in step 2144, operation proceeds to step 2150 where the MIRROR-TEST-FAIL flag is tested to determine if the mirror test failed. If so, operation proceeds to step 2152 where the POSTED-WRITE-ENABLED flag is cleared and the disable code is defined as "PERM_MIRROR_TEST_FAIL" indicating a permanent error. Operation then proceeds to step 2148. Otherwise, if the mirror test did not fail, operation proceeds to step 2154 where the PARITY-WRITE-ERROR flag is tested. If a parity write error has occurred, operation proceeds to step 2156 where the POSTED-WRITES-ENABLED flag is cleared and the disable code is defined as "PERM-WRITE-SOFT-ERROR" indicating a permanent software error condition. Operation then proceeds to step 2148. If a parity write error has not previously occurred, operation proceeds to step 2158 where a SET-CONFIG-WAS-ISSUED flag is monitored indicating a permanent disable condition. If so, the POSTED-WRITES-ENABLED flag is cleared and the disable code is defined as "PERM-NEEDS-CONFIG." Operation then proceeds to step 2148. Posted write operations are permanently disabled until a set posted writes command is issued for the purpose of configuring and controlling read cache and posted write operation parameters. Otherwise, if the tests pass in steps 2144, 2150, 2154 and 2158, operation proceeds to step 2162 where the POSTED-WRITES-ENABLED flag is set true and then the update cache status routine exits through step 2126. Posted write operations are subsequently enabled if no error conditions exist.

In summary, a posted write cache according to the present invention provides secure write posting capability to a disk controller to allow write posting performance in critical situations such as file servers. A cache of mirrored, parity-checked, battery-backed semiconductor memory is provided to serve as a write posting cache. Write data is written to the posted write cache and a complete indication is returned. Status information stored in the posted write cache is updated indicating whether dirty data exists and its location. A flush routine searches for dirty data, consolidates contiguous data, and establishes write requests to flush the data to the disk drive system. If primary power fails, the battery back-up retains dirty data in the posted write cache for a generally sufficient period of time. Parity checking allows determination of errors prior to actual storage, and mirroring decreases the risk of data loss due to hardware failure.

Furthermore, a method according to the present invention determines whether valid dirty data exists in the posted write cache upon power up. The batteries 936 are switched into a standby mode when new data is written to the posted write cache memory 71, and are switched out of standby mode when all dirty data is flushed to the disk array A. Thus, the presence of a cache signature previously written to the posted write cache indicates dirty data saved by the batteries 936 if a power failure occurred. A configuration identification code is then checked which assures a match between the posted write cache and the disk array A. If there is no match, the user is warned. A mirror test assures the dirty data is valid. After the mirror test or if the cache signature is not found, a battery status register is read which allows determination of available battery power to assure power is available before posted write operations are enabled.

If the cache signature is not present and the battery status is satisfactory, certain further errors are detected, but unless present, posted write operations are enabled. If the cache signature is not present and the battery status is not satisfactory, a possible loss of data error message is provided and then the further errors are detected before possible, but unlikely, enabling. Fatal hardware and software errors are detected and stored in a configuration file in the disk array A to prevent subsequent use of a failed posted write cache memory 71. Other temporary errors are constantly monitored and updated so that posted write operations are only enabled when error-free operation is assured.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A data controller for receiving and temporarily storing data intended for a disk drive system and for transferring the data to the disk drive system, the data being considered dirty before being written to the disk drive system, wherein the data controller receives primary power during normal operation from a host computer, said data controller comprising:

cache memory for storing both dirty data and a predetermined cache signature;

battery means coupled to said cache memory for maintaining both said dirty data and said cache signature in said cache memory in the event of a failure of the primary power; and means coupled to said cache memory for controlling data flow between the host computer, said cache memory and the disk drive system, said data flow controlling means including:

means for receiving dirty data and for writing the dirty data and said cache signature to said cache memory, means receiving a dirty data indication for flushing any dirty data in said cache memory to the disk drive system, and means for retrieving said cache signature from said cache memory upon power up of the host computer and the data controller, for determining if said cache signature is valid, and for providing said dirty data indication if said cache signature is valid.

2. The data controller of claim 1, wherein said data flow controlling means further includes means for initializing said cache memory, wherein if said cache signature is not valid upon power up, said cache memory initializing means initializes said cache memory, said initializing including writing said cache signature.

3. The data controller of claim 1, further comprising:

battery monitoring means coupled to said battery means for providing a battery charge signal indicative of a charge level of said battery means.

4. The data controller of claim 3, wherein said data flow controlling means further comprises:

means coupled to said battery charge signal for determining if the charge level of said battery means is below a first predetermined level; and means for providing a warning message to the host computer if said cache signature is not valid and if the charge level of said battery means is below said first predetermined level upon power up of the host computer and the data controller.

5. The data controller of claim 4, wherein said data flow controlling means further includes:

controllable means for utilizing dirty data written to said cache memory for performing posted write operations, responsive to an enable indication; and means for indicating enabling or disabling of posted write operations.

6. The data controller of claim 5, further comprising:

means coupled to said battery charge signal for determining if the charge level of said battery means is below a second predetermined level; and wherein while the charge level of said battery means is below said second predetermined level, said enabling or disabling indicating means indicates posted write operations are disabled.

7. The data controller of claim 6, wherein if said cache signature is not valid and the charge level of said battery means is above said second predetermined level upon power up of the host computer and the data controller, said enabling or disabling indicating means indicates posted write operations are enabled.

8. The data controller of claim 1, wherein dirty data flushing means further including means for determining when all the dirty data is flushed from said cache memory; and wherein data flow controlling means further comprises:

means coupled to cache memory writing means and said dirty data flushing means for determining when all the dirty data is flushed from said cache memory for placing said battery means in and out of standby mode, wherein said battery means is placed in standby mode when dirty data is written to said cache memory and wherein said battery means is placed out of standby mode when all dirty data within said cache memory has been flushed.

9. The data controller of claim 1, wherein said cache memory further stores status information of the dirty data indicating whether the data is dirty and indicating a location of the dirty data within said cache memory.

10. The data controller of claim 1, wherein said data flow controlling means further includes:

controllable means for utilizing dirty data written to said cache memory for performing posted write operations, responsive to an enable indication; and means for indicating enabling or disabling of posted write operations.

11. The data controller of claim 10, wherein:

said cache memory is mirrored having a first half and a mirrored half, wherein said cache memory stores the dirty data in said first half and further stores a duplicate copy of the dirty data in said mirrored half of said cache memory.

12. The data controller of claim 11, wherein said data flow controller further comprises:

means for performing a mirror test wherein all of said first copy of the dirty data within said first half of said cache memory is compared with said corresponding portions of said duplicate copy of the dirty data in said mirrored half of said cache memory.

13. The data controller of claim 12, wherein if said cache signature is valid, said mirror test performing means performs said mirror test and if said mirror test fails wherein said first copy is not equal to said duplicate copy, said enabling or disabling indicating means indicates posted write operations are disabled, and if said mirror test passes wherein said first copy is equal to said duplicate copy, said enabling or disabling indicating means indicates posted write operations are enabled.

14. The data controller of claim 10, wherein said cache memory further stores dirty data parity information.

15. The data controller of claim 14, wherein said data flow controlling means further comprises:
means for detecting parity errors when writing dirty data to and when flushing dirty data from said cache memory, wherein if a parity error is detected, said enabling or disabling indicating means indicates posted write operations are disabled.

16. The data controller of claim 10, wherein
said cache memory further stores an identification number and the disk drive system stores a copy of said identification number; and
wherein said cache signature retrieving means further includes means for retrieving and comparing said identification codes from said cache memory and the disk drive system, wherein if said identification codes match, said enabling or disabling indicating means indicates posted write operations are enabled and if said identification codes do not match, said enabling or disabling indicating means indicates posted write operations are disabled.

17. A method for determining if dirty data exists in a posted write cache upon power up of a computer system including a data controller and a disk drive system, wherein data intended for the disk drive system is received, temporarily stored in the posted write cache and transferred to the disk drive system, the data being considered dirty before being written to the disk drive system, wherein the computer system provides primary power to the data controller which includes the posted write cache, controllable means responsive to an enable condition for implementing posted write operations wherein dirty data is temporarily stored in the posted write cache, and a battery means for maintaining data in the posted write cache in the event primary power fails, said method comprising the steps of:
writing a predetermined cache signature into the posted write cache at a predetermined location;
writing dirty data into the posted write cache;
if a dirty data indication indicates dirty data is in the posted write cache, flushing the dirty data from the posted write cache to the disk drive system;
upon power up of the computer system, retrieving the cache signature from the posted write cache;
verifying the cache signature to a predetermined cache signature; and
if the cache signature is verified, providing the dirty data indication.

18. The method of claim 17, further comprising the step of initializing the posted write cache if the cache signature is not verified.

19. The method of claim 17, after said step of verifying the cache signature, further comprising the step of checking a charge status of the battery means.

20. The method of claim 19, after said step of checking the charge status of the battery means, further comprising the step of:
warning the user of the computer system of possible data loss if a charge level of the battery means is below a first predetermined level and if the cache signature is not found.

21. The method of claim 19, after said step of checking the charge status of the battery means, further comprising the step of:
indicating posted write operations are disabled if the charge level of the battery means is below a second predetermined level.

22. The method of claim 19, after said step of checking the charge status of the battery means, further comprising the step of:
indicating posted write operations are enabled if the charge level of the battery means is above a second predetermined level and if the cache signature is not found.

23. The method of claim 17, wherein the computer system includes apparatus for switching on and off the battery means, said method further comprising the steps of:
after said step of writing dirty data into the posted write cache, switching on the battery means;
after said flushing step, determining if more dirty data exists in the posted write cache and switching off the battery means if the posted write cache does not contain dirty data.

24. The method of claim 17, wherein the posted write cache is in a mirrored configuration, the method further comprising the steps of:
after said cache signature writing step, writing a duplicate copy of the cache signature into a mirrored location in the posted write cache;
after said writing dirty data step, writing a duplicate copy of the dirty data into a corresponding mirrored location in the posted write cache; and
after said verifying step, if the cache signature is verified, searching the posted write cache for dirty data; and
reading the dirty data and its duplicated copy from the posted write cache and comparing the dirty data with its duplicate copy if dirty data is found in said searching step.

25. The method of claim 24, further comprising the steps of:
indicating posted write operations are enabled if the dirty data and its duplicate copy match; and
indicating posted write operations are disabled if the dirty data and its duplicate copy do not match.

26. The method of claim 24, wherein the posted write cache further stores dirty data parity information, further comprising the steps of:
during said reading and comparing step, checking for parity errors; and
indicating posted write operations are disabled if a parity error occurs reading a portion of the dirty data and the corresponding portion of its mirrored copy.

27. The method of claim 17, further comprising the steps of:
writing a first copy of an identification code to the disk drive system and writing a second copy to the posted write cache;
after power up of the computer system, reading the first and second copies of the identification code from the disk drive system and the posted write cache;
after said identification code reading step, comparing the first and second copies of the identification code;
indicating posted write operations are disabled and providing a warning message to the computer system if the first and second copies of the identification code do not match; and
indicating posted write operations are enabled if the first and second copies of the identification code do match.

* * * * *

UNITED STATES PATENT AND TRADEMARK OFFICE
CERTIFICATE OF CORRECTION

PATENT NO. : 5,448,719

DATED : September 5, 1995

INVENTOR(S) : Stephen M. Schultz et al.

It is certified that error appears in the above-identified patent and that said Letters Patent is hereby corrected as shown below:

In col. 25, line 49, please replace "initializing" with --initialization--.

Signed and Sealed this

Twenty-eighth Day of November 1995

Attest:

BRUCE LEHMAN

*Attesting Officer*    *Commissioner of Patents and Trademarks*